United States Patent
Zhu

(10) Patent No.: US 12,249,544 B2
(45) Date of Patent: Mar. 11, 2025

(54) SEMICONDUCTOR DEVICE, METHOD OF MANUFACTURING THE SAME AND ELECTRONIC DEVICE INCLUDING THE DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/317,722

(22) Filed: May 15, 2023

(65) Prior Publication Data
US 2023/0369489 A1    Nov. 16, 2023

Related U.S. Application Data

(63) Continuation of application No. 17/033,284, filed on Sep. 25, 2020, now Pat. No. 11,695,074, which is a
(Continued)

(30) Foreign Application Priority Data

Sep. 30, 2016   (CN) .......................... 201610872541.2
Jun. 30, 2017   (CN) .......................... 201710530685.4

(51) Int. Cl.
H01L 21/8238    (2006.01)
B82Y 10/00      (2011.01)
(Continued)

(52) U.S. Cl.
CPC ...... *H01L 21/823885* (2013.01); *B82Y 10/00* (2013.01); *G05B 23/0216* (2013.01);
(Continued)

(58) Field of Classification Search
CPC ....... H01L 21/823885; H01L 21/02532; H01L 21/02636; H01L 21/2236; H01L 21/2252;
(Continued)

(56) References Cited

U.S. PATENT DOCUMENTS

| 5,554,870 A | 9/1996 | Fitch et al. |
| 6,943,407 B2 | 9/2005 | Ouyang et al. |

(Continued)

FOREIGN PATENT DOCUMENTS

| CN | 1901225 | 1/2007 |
| CN | 1906769 | 1/2007 |

(Continued)

OTHER PUBLICATIONS

International Search Report with Written Opinion, issued in the related PCT application No. PCT/CN2017/095178, dated Nov. 3, 2017, 20 pages.

(Continued)

*Primary Examiner* — Victor A Mandala
(74) *Attorney, Agent, or Firm* — HSML P.C.

(57) ABSTRACT

There are provided a semiconductor device, a method of manufacturing the same, and an electronic device including the device. According to an embodiment, the semiconductor device may include a substrate, and a first device and a second device formed on the substrate. Each of the first device and the second device includes a first source/drain layer, a channel layer and a second source/drain layer stacked on the substrate in sequence, and also a gate stack surrounding a periphery of the channel layer. The channel (Continued)

layer of the first device and the channel layer of the second device are substantially co-planar.

19 Claims, 18 Drawing Sheets

Related U.S. Application Data continuation of application No. 15/720,913, filed on Sep. 29, 2017, now Pat. No. 10,833,193.

(51) Int. Cl.

| | |
|---|---|
| *G05B 23/02* | (2006.01) |
| *G06T 19/00* | (2011.01) |
| *H01L 21/02* | (2006.01) |
| *H01L 21/223* | (2006.01) |
| *H01L 21/225* | (2006.01) |
| *H01L 21/3065* | (2006.01) |
| *H01L 21/308* | (2006.01) |
| *H01L 21/324* | (2006.01) |
| *H01L 21/822* | (2006.01) |
| *H01L 21/8234* | (2006.01) |
| *H01L 23/522* | (2006.01) |
| *H01L 27/092* | (2006.01) |
| *H01L 29/04* | (2006.01) |
| *H01L 29/06* | (2006.01) |
| *H01L 29/08* | (2006.01) |
| *H01L 29/10* | (2006.01) |
| *H01L 29/15* | (2006.01) |
| *H01L 29/165* | (2006.01) |
| *H01L 29/205* | (2006.01) |
| *H01L 29/267* | (2006.01) |
| *H01L 29/417* | (2006.01) |
| *H01L 29/423* | (2006.01) |
| *H01L 29/45* | (2006.01) |
| *H01L 29/66* | (2006.01) |
| *H01L 29/775* | (2006.01) |
| *H01L 29/778* | (2006.01) |
| *H01L 29/78* | (2006.01) |
| *H01L 29/786* | (2006.01) |
| *H04N 7/18* | (2006.01) |
| *H04N 23/698* | (2023.01) |
| *G06F 3/04817* | (2022.01) |
| *G06F 3/0482* | (2013.01) |
| *G06V 20/40* | (2022.01) |
| *H01L 21/3105* | (2006.01) |
| *H04N 13/111* | (2018.01) |
| *H04N 13/332* | (2018.01) |
| *H04N 13/366* | (2018.01) |
| *H04N 13/398* | (2018.01) |
| *H04N 23/90* | (2023.01) |

(52) U.S. Cl.
CPC ...... *G06T 19/006* (2013.01); *H01L 21/02532* (2013.01); *H01L 21/02636* (2013.01); *H01L 21/2236* (2013.01); *H01L 21/2252* (2013.01); *H01L 21/2253* (2013.01); *H01L 21/2258* (2013.01); *H01L 21/3065* (2013.01); *H01L 21/3083* (2013.01); *H01L 21/324* (2013.01); *H01L 21/8221* (2013.01); *H01L 21/823412* (2013.01); *H01L 21/823418* (2013.01); *H01L 21/82345* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 21/823878* (2013.01); *H01L 23/5221* (2013.01); *H01L 27/092* (2013.01); *H01L 27/0925* (2013.01); *H01L 29/04* (2013.01); *H01L 29/0638* (2013.01); *H01L 29/0653* (2013.01); *H01L 29/0676* (2013.01); *H01L 29/0847* (2013.01); *H01L 29/1037* (2013.01); *H01L 29/1054* (2013.01); *H01L 29/1083* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66545* (2013.01); *H01L 29/6656* (2013.01); *H01L 29/66666* (2013.01); *H01L 29/66712* (2013.01); *H01L 29/66742* (2013.01); *H01L 29/775* (2013.01); *H01L 29/7788* (2013.01); *H01L 29/7813* (2013.01); *H01L 29/7827* (2013.01); *H01L 29/7848* (2013.01); *H01L 29/78618* (2013.01); *H01L 29/78642* (2013.01); *H01L 29/78696* (2013.01); *H04N 7/181* (2013.01); *H04N 23/698* (2023.01); *G05B 2219/32014* (2013.01); *G06F 3/04817* (2013.01); *G06F 3/0482* (2013.01); *G06V 20/40* (2022.01); *G06V 20/44* (2022.01); *G06V 2201/06* (2022.01); *H01L 21/31053* (2013.01); *H01L 21/823828* (2013.01); *H01L 29/0649* (2013.01); *H04N 13/111* (2018.05); *H04N 13/332* (2018.05); *H04N 13/366* (2018.05); *H04N 13/398* (2018.05); *H04N 23/90* (2023.01)

(58) Field of Classification Search
CPC ............ H01L 21/2253; H01L 21/2258; H01L 21/3065; H01L 21/3083; H01L 21/324; H01L 21/8221; H01L 21/823412; H01L 21/823418; H01L 21/82345; H01L 21/823475; H01L 21/823487; H01L 21/823807; H01L 21/823814; H01L 21/823842; H01L 21/823864; H01L 21/823871; H01L 21/823878; H01L 23/5221; H01L 27/092; H01L 27/0925; H01L 29/04; H01L 29/0638; H01L 29/0653; H01L 29/0676; H01L 29/0847; H01L 29/1037; H01L 29/1054; H01L 29/1083; H01L 29/1095; H01L 29/152; H01L 29/165; H01L 29/205; H01L 29/267; H01L 29/41741; H01L 29/42376; H01L 29/42392; H01L 29/45; H01L 29/66431; H01L 29/66439; H01L 29/66462; H01L 29/66469; H01L 29/66522; H01L 29/66545; H01L 29/6656; H01L 29/66666; H01L 29/66712; H01L 29/66742; H01L 29/775; H01L 29/7788; H01L 29/7813; H01L 29/7827; H01L 29/7848; H01L 29/78618; H01L 29/78642; H01L 29/78696; H01L 21/31053; H01L 21/823828; H01L 29/0649; H01L 21/8234; H01L 21/823437; H01L 27/088; H04N 7/181; H04N 23/698; H04N 13/111; H04N 13/332; H04N 13/366; H04N 13/398;

H04N 23/90; G06V 20/40; G06V 20/44;
G06V 2201/06; G06F 3/04817; G06F
3/0482; G06T 19/006; G05B 23/0216;
G05B 2219/32014; B82Y 10/00

See application file for complete search history.

(56) References Cited

U.S. PATENT DOCUMENTS

| | | | |
|---|---|---|---|
| 9,196,730 | B1 | 11/2015 | Yu et al. |
| 9,214,235 | B2* | 12/2015 | Rhie ................ H10B 43/27 |
| 9,251,888 | B1* | 2/2016 | Liaw ................ H01L 29/78642 |
| 9,685,537 | B1 | 6/2017 | Xie et al. |
| 9,786,758 | B1 | 10/2017 | Balakrishnan et al. |
| 9,853,102 | B2* | 12/2017 | Tsai ................ H01L 21/823418 |
| 10,164,040 | B2* | 12/2018 | Colinge ............ H01L 21/28114 |
| 10,833,193 | B2* | 11/2020 | Zhu ................ H01L 27/092 |
| 2001/0017392 | A1* | 8/2001 | Comfort ............ H01L 29/7827 |
| | | | 438/269 |
| 2002/0076884 | A1 | 6/2002 | Weis |
| 2003/0047749 | A1* | 3/2003 | Chaudhry ......... H01L 29/42392 |
| | | | 257/E29.313 |
| 2003/0116792 | A1 | 6/2003 | Chen et al. |
| 2004/0063286 | A1 | 4/2004 | Kim et al. |
| 2004/0157353 | A1 | 8/2004 | Ouyang et al. |
| 2006/0226495 | A1 | 10/2006 | Kwon |
| 2006/0255330 | A1 | 11/2006 | Chen et al. |
| 2007/0196973 | A1 | 8/2007 | Park |
| 2008/0067607 | A1 | 3/2008 | Verhulst et al. |
| 2010/0295136 | A1* | 11/2010 | Or-Bach ........... H01L 21/76254 |
| | | | 257/390 |
| 2010/0327319 | A1 | 12/2010 | Iacopi et al. |
| 2013/0082333 | A1 | 4/2013 | Chen et al. |
| 2014/0042524 | A1* | 2/2014 | Chuang ........... H01L 21/823885 |
| | | | 257/329 |
| 2015/0017767 | A1 | 1/2015 | Masuoka et al. |
| 2015/0171032 | A1* | 6/2015 | Colinge ............ H01L 27/0266 |
| | | | 257/355 |
| 2015/0171143 | A1* | 6/2015 | Park ................ H10B 63/34 |
| | | | 257/295 |
| 2015/0194423 | A1* | 7/2015 | Wang ............... H01L 27/088 |
| | | | 257/329 |
| 2015/0200288 | A1 | 7/2015 | Zhang et al. |
| 2015/0228759 | A1* | 8/2015 | Chen ................ H01L 27/0928 |
| | | | 438/692 |
| 2015/0249143 | A1 | 9/2015 | Sano et al. |
| 2015/0295040 | A1* | 10/2015 | Tsai ................ H01L 27/0928 |
| | | | 438/224 |
| 2015/0333152 | A1* | 11/2015 | Lin ................ H01L 21/28512 |
| | | | 257/329 |
| 2015/0357432 | A1* | 12/2015 | Lin ................ H01L 21/76224 |
| | | | 257/24 |
| 2015/0364358 | A1* | 12/2015 | Tsai ................ B82Y 10/00 |
| | | | 438/400 |
| 2015/0372083 | A1* | 12/2015 | Tang ................ H01L 29/42372 |
| | | | 438/268 |
| 2015/0380539 | A1* | 12/2015 | Colinge ............ H01L 29/40114 |
| | | | 438/268 |
| 2015/0380555 | A1 | 12/2015 | Ohtou et al. |
| 2016/0049397 | A1* | 2/2016 | Chang ................ H01L 27/092 |
| | | | 257/329 |
| 2016/0064541 | A1* | 3/2016 | Diaz ................ H01L 29/0847 |
| | | | 257/329 |
| 2016/0078922 | A1* | 3/2016 | Liaw ................ H01L 29/7827 |
| | | | 365/51 |
| 2016/0204251 | A1 | 7/2016 | Masuoka et al. |
| 2016/0211368 | A1* | 7/2016 | Chen ................ H01L 29/66666 |
| 2016/0268256 | A1 | 9/2016 | Yang et al. |
| 2016/0284712 | A1* | 9/2016 | Liaw ................ H10B 10/12 |
| 2016/0293739 | A1 | 10/2016 | Zhang |
| 2016/0315084 | A1 | 10/2016 | Wu et al. |
| 2016/0372316 | A1 | 12/2016 | Yang et al. |
| 2017/0077231 | A1 | 3/2017 | Balakrishnan et al. |
| 2017/0170196 | A1 | 6/2017 | Anderson et al. |
| 2017/0194318 | A1 | 7/2017 | Balakrishnan et al. |
| 2017/0301776 | A1* | 10/2017 | Zhang ................ H01L 29/7827 |
| 2017/0338334 | A1 | 11/2017 | Cheng et al. |
| 2017/0345927 | A1 | 11/2017 | Cantoro et al. |
| 2018/0047832 | A1 | 2/2018 | Tapily et al. |
| 2018/0248004 | A1* | 8/2018 | Majhi ................ H01L 29/42392 |
| 2018/0254322 | A1 | 9/2018 | Cheng et al. |
| 2018/0277676 | A1 | 9/2018 | Basker et al. |
| 2019/0172928 | A1 | 6/2019 | Gluschenkov et al. |
| 2020/0118890 | A1 | 4/2020 | Bao et al. |

FOREIGN PATENT DOCUMENTS

| | | |
|---|---|---|
| CN | 102299154 | 12/2011 |
| CN | 103337519 | 10/2013 |
| CN | 104022121 | 9/2014 |
| CN | 101399207 | 10/2014 |
| CN | 104103515 | 10/2014 |
| CN | 105280705 | 1/2016 |
| CN | 106298778 | 1/2017 |
| CN | 107706094 | 2/2018 |

OTHER PUBLICATIONS

First Non-Final Office Action, issued in the related U.S. Appl. No. 16/337,878, dated Aug. 16, 2020, 16 pages.
Final Office Action, issued in the related U.S. Appl. No. 16/337,878, dated Feb. 22, 2021, 11 pages.
Final Office Action, issued in the related U.S. Appl. No. 16/337,882, dated Aug. 31, 2021, 34 pages.
Second Non-Final Office, issued in the related U.S. Appl. No. 16/337,882, dated Dec. 15, 2021, 31 pages.
"Diamond cubic", available at https://en.wikipedia.org/wiki/Diamond_cubic, 2021, 4 pages.
"Germanium-tin", available at https://en.wikipedia.org/wiki/Germanium-tin, 2021, 2 pages.
"What is InGaAs?", available at https://www.sensorsinc.com/technology/what-is-ingaas, Collins Aerospace, 2021, 7 pages.
International Search Report, issued in the corresponding PCT application No. PCT/CN2017/095130, dated Oct. 13, 2017, 6 pages.
First Office Action, issued in the corresponding Chinese patent application No. 201710530685.4, dated Aug. 28, 2019, 7 pages.
Second Chinese Office Action, issued in the corresponding Chinese patent application No. 201710530685.4, dated Apr. 15, 2020, 10 pages.
International Search Report and Written Opinion, International Patent Application No. PCT/CN2017/095124, Nov. 9, 2017, with English translation (20 pages).
U.S. Non-final Office Action, issued in the corresponding U.S. Appl. No. 15/720,913, dated Dec. 27, 2018, 10 pages.
Non-final Office Action, issued in the related U.S. Appl. No. 16/337,882, dated Mar. 1, 2021, 38 pages.
Non-final Office Action, issued in the related U.S. Appl. No. 16/860,707, dated May 24, 2021, 10 pages.
Qin et al., "A Unified Channel Potential Model for Asymmetrical Dual Gate a-Si : H Thin Film Transistors", Journal of South China University of Technology, vol. 44, No. 1, Jan. 2016, 8 pages.
First Chinese Office Action, issued in the corresponding Chinese patent application No. 202010840234.2, dated Nov. 8, 2022, 9 pages.

* cited by examiner

SEMICONDUCTOR DEVICE, METHOD OF MANUFACTURING THE SAME AND ELECTRONIC DEVICE INCLUDING THE DEVICE

CROSS-REFERENCE TO RELATED APPLICATION(S)

This application claims priority to Chinese Application No. 201610872541.2, filed on Sep. 30, 2016, and also Chinese Application No. 201710530685.4, filed on Jun. 30, 2017, which are incorporated herein by reference in their entireties.

TECHNICAL FIELD

The present disclosure relates generally to the semiconductor field, and more particularly, to a vertical semiconductor device, a method of manufacturing the same, and an electronic device including the semiconductor device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, it is generally required to reduce an area occupied by the source, the drain and the gate so as to scale down a footprint of the planar device, which may deteriorate performances of the device (for example, increased power consumption and resistance). Therefore, the area of the planar device is difficult to be further scaled down. In contrast, in a vertical device, a source, a gate and a drain are arranged in a direction substantially perpendicular to a substrate surface. As a result, a footprint of the vertical device is easier to be scaled down compared to the planar device.

SUMMARY

In view of the above, the present disclosure aims to provide, among others, a vertical semiconductor device with improved characteristics, a method of manufacturing the same, and an electronic device including the semiconductor device.

According to an aspect of the present disclosure, there is provided a semiconductor device, comprising: a substrate; a first device and a second device formed on the substrate, wherein each of the first device and the second device comprises: a first source/drain layer, a channel layer and a second source/drain layer stacked on the substrate in sequence; and a gate stack surrounding a periphery of the channel layer, wherein the channel layer of the first device and the channel layer of the second device are substantially co-planar.

According to a further aspect of the present disclosure, there is provided a method of manufacturing a semiconductor device, comprising: epitaxially growing a first source/drain layer on a substrate; forming channel layers on the first source/drain layer which are substantially co-planar in a first device region and a second device region; epitaxially growing a second source/drain layer on the channel layers; defining, in the first device region and the second device region, an active region of the first device and an active region of the second device, respectively, from the first source/drain layer, the channel layers and the second source/drain layer which are stacked; and forming gate stacks of the respective devices surrounding peripherals of the respective channel layers in the respective active regions of the first device and the second device, respectively.

According to a further aspect of the present disclosure, there is provided an electronic device comprising an Integrated Circuit (IC) comprising the above described semiconductor device.

According to embodiments of the present disclosure, in the vertical device, the gate stack surrounds the periphery of the channel layer and the channel is formed in the channel layer. Thus, the gate length is determined substantially by the thickness of the channel layer. The channel layer may be formed by, for example, epitaxy, and thus the thickness thereof can be well controlled. Therefore, the gate length can be well controlled. The vertical devices formed in different regions on the substrate may have different channel lengths. The periphery of the channel layer may be recessed inwards with respect to that of the first source/drain layer and the second source/drain layer, so that the gate stack can be embedded into the recess, to reduce or even avoid overlap with the source/drain regions and thus contribute to reduced parasitic capacitance between the gate and the source/drain. Further, the channel layer may comprise a single-crystalline semiconductor material, resulting in improved carrier mobility and lower current leakage and thus enhanced device performances.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1:
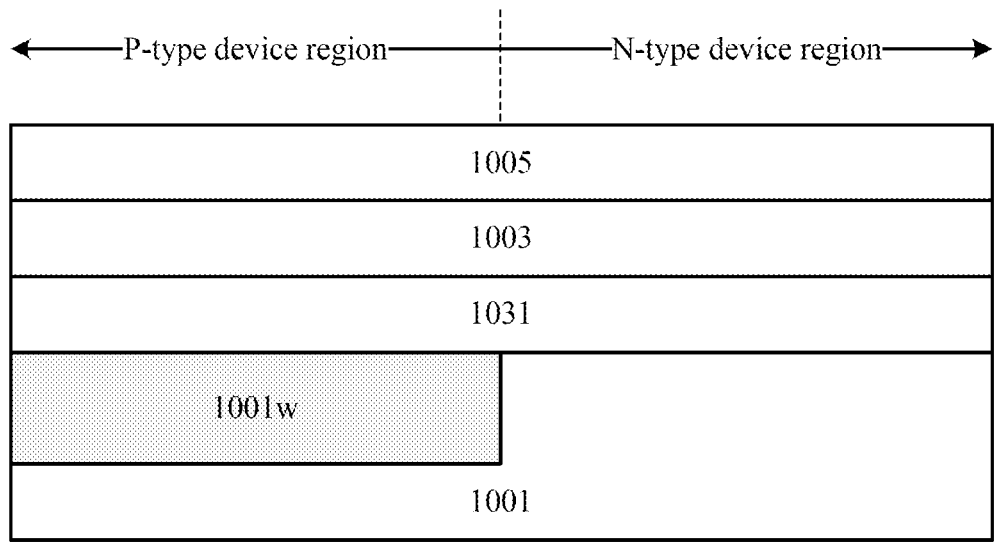
FIGS. 1-19 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A semiconductor device according to embodiments of the present disclosure is based on a vertical device. Such a vertical device may include a first source/drain layer, a channel layer and a second source/drain layer stacked on a substrate in sequence. The respective layers may be contiguous to each other, or may have another semiconductor layer interposed therebetween, for example, a leakage suppression layer or an ON current enhancement layer (i.e., a semiconductor layer having a band gap greater than or less than that of an adjacent layer). Source/drain regions of the device may be formed in the first source/drain layer and the second source/drain layer, while a channel region of the device may be formed in the channel layer. A conductive channel may be formed through the channel region between the source/drain regions on opposite ends of the channel region.

A gate stack may be formed to surround a periphery of the channel layer. As a result, a gate length may be determined substantially by the thickness of the channel layer itself, rather than depending on timing etching as in the conventional art. The channel layer may be formed by, for example, epitaxy, and thus the thickness thereof can be well controlled. Therefore, the gate length can be well controlled.

The respective channel layers of the devices in different device regions on the substrate may be substantially co-planar, for example, they may extend in a plane substantially parallel to a surface of the substrate. In an example, upper surfaces and/or lower surfaces of the channel layers in the respective device regions may be substantially co-planar. Thus, the channel layers in the respective device regions may have different thicknesses, and accordingly may have different channel lengths.

The channel layer may have its periphery recessed to that of the first source/drain layer and the second source/drain layer. Then, the formed gate stack may be embedded into a recess of the channel layer with respect to the first source/drain layer and the second source/drain layer. Preferably, an extent of the gate stack in a stack direction (a vertical direction, for example, approximately perpendicular to the substrate surface) of the first source/drain layer, the channel layer and the second source/drain layer is within an extent of the recess in that direction. Thereby, overlap with the source/drain regions can be reduced or even avoided, thus contributing to reduced parasitic capacitance between the gate and the source/drain.

In a case that the first device and the second device are of different conductivity types (for example, the first device is an n-type device and the second device is a p-type device), the gate stack, particularly, a gate conductor layer therein, may need to be formed differently for the first device and the second device (for example, the gate conductor layers of the n-type device and the p-type device are formed using gate conductor materials with different work functions, respectively). For example, the first device and the second device may comprise corresponding gate conductor materials with suitable work functions and embedded into corresponding recesses.

In addition, for convenience of manufacturing an electrical contact to the gate conductor layer, a gate contact pad leading from the gate conductor layer may also be included. The gate contact pad may be in electrical contact with the gate stack (specifically, the gate conductor layer), and extend in a direction away from the channel layer (for example, extend beyond the periphery of the active region). Advantageously, for convenience of manufacture, the gate contact pad may be formed using the gate conductor layer of one (for example, the first device) of the first device and the second device, even for the other device (for example, the second device). For example, the gate conductor layer of the one device (for example, the first device) may extend outwards from the corresponding recess to act as the gate contact pad, and in addition, another portion of the gate conductor layer may extend to the gate conductor layer of the other device (for example, the second device) to act as the gate contact pad.

The channel layer may be made of a single-crystalline semiconductor material to improve device performances. Of course, the first source/drain layer and the second source/drain layer may also be made of a single-crystalline semiconductor material. In this case, the single-crystalline semiconductor material of the channel layer and the single-crystalline semiconductor material of the source/drain layers may be a cocrystal. Mobility of electrons or holes of the single-crystalline semiconductor material of the channel layer may be greater than that of the first source/drain layer and the second source/drain layer. Further, a forbidden band gap of the first source/drain layer and the second source/drain layer may be greater than that of the single-crystalline semiconductor material of the channel layer.

According to embodiments of the present disclosure, the single-crystalline semiconductor material of the channel layer may have the same crystal structure as that of the first source/drain layer and the second source/drain layer. In this case, a lattice constant of the first source/drain layer and the second source/drain layer without being strained may be greater than that of the single-crystalline semiconductor material of the channel layer without being strained. Then, the mobility of carriers of the single-crystalline semiconductor material of the channel layer may be greater than that if without being strained, or an effective mass of light carriers of the single-crystalline semiconductor material of the channel layer may be less than that if without being strained, or a concentration of light carriers of the single-crystalline semiconductor material of the channel layer may be greater than that if without being strained. Alternatively, the lattice constant of the first source/drain layer and the second source/drain layer without being strained may be less than the lattice constant of the single-crystalline semiconductor material of the channel layer without being strained. Then, the mobility of electrons of the single-crystalline semiconductor material of the channel layer may be greater than that if without being strained, or an effective mass of electrons of the single-crystalline semiconductor material of the channel layer may be less than that if without being strained.

According to embodiments of the present disclosure, doping of the source/drain regions may move partially into end portions of the channel layer close to the first source/ drain layer and the second source/drain layer. As a result, there may be a doping distribution in the end portions of the channel layer close to the first source/drain layer and the second source/drain layer, while helps reducing resistance between the source/drain region and the channel region when the device is ON and thus improving the device performances.

According to embodiments of the present disclosure, the channel layer may comprise a semiconductor material different from that of the first source/drain layer and the second source/drain layer. Thus, it facilitates processing the channel layer by, for example, selective etching, to recess the channel layer with respect to the first source/drain layer and the second source/drain layer. Further, the first source/drain layer and the second source/drain layer may comprise the same semiconductor material as each other.

The respective layers in the active regions may be formed by epitaxy, so that thicknesses thereof can be controlled accurately. For example, the first source/drain layer may be a semiconductor layer epitaxially grown on the substrate, the channel layer may be a semiconductor layer epitaxially grown on the first source/drain layer, and the second source/drain layer may be a semiconductor layer epitaxially grown on the channel layer.

According to embodiments of the present disclosure, stressed liners may be disposed on surfaces of the respective first and second source/drain layers of the respective first and second devices. For an n-type device, the stressed liner may be compressive stressed to create tensile stress in the channel layer; and for a p-type device, the stressed liner may be tensile stressed to create compressive stress in the channel layer. As a result, the device performances can be further improved.

According to embodiments of the present disclosure, the first device and the second device may be of different conductivity types, and therefore may be configured as Complementary Metal Oxide Semiconductor (CMOS).

Such a semiconductor device may be manufactured as follows. Specifically, a first source/drain layer is epitaxially grown on a substrate, a channel layer which is substantially co-planar in a first device region and a second device region is formed on the first source/drain layer, and a second source/drain layer is epitaxially grown on the channel layers. The channel layer may have its thickness well controlled in the epitaxy process. Since the respective layers are epitaxially grown respectively, there may be a clear crystalline interface between at least some adjacent layers. Further, the respective layers may be doped respectively, and then there may be a doping concentration interface between at least some adjacent layers.

The channel layer may be processed to have different thicknesses in the first device region and the second device region. For example, after the growth of the channel layer, a portion of the channel layer in one of the device regions may be thinned (for example, by etching) or may be further grown in one of the device regions. Or alternatively, after the growth of the first source/drain layer, a portion of the first source/drain layer in one of the device regions may be thinned (for example, by etching) and then the channel layer is grown thereon.

For the first source/drain layer, the channel layer and the second source/drain layer which are stacked, active regions of the first device and the second device may be defined in the first device region and the second device region, respectively. For example, those layers may be selectively etched in sequence into a desired shape. The respective active regions of the first device and the second device may be obtained from the same first source/drain layer, channel layer and second source/drain layer. Generally, the active region may have a pillar shape (for example, a cylindrical shape). The etching of the first source/drain layer may be performed with respect to only an upper portion of first source/drain layer, so that a lower portion of the first source/drain layer may extend beyond the periphery of the upper portion, for convenience of connection to the source/drain region formed in the first source/drain layer in subsequent processes. Then, gate stacks may be formed to surround a periphery of the respective channel layers.

Further, the periphery of the channel layer may be recessed with respect to peripheries of the first source/drain layer and the second source/drain layer, to define spaces for receiving the respective gate stacks. For example, this can be done by selective etching. In this case, the gate stacks may be embedded into the respective recesses.

Source/drain regions may be formed in the first source/drain layer and the second source/drain layer. For example, this can be done by doping the first source/drain layer and the second source/drain layer. For example, ion implantation, plasma doping, etc. may be performed. In an advantageous example, sacrificial gates may be formed in the respective recesses of the periphery of the channel layers with respect to the periphery of the first source/drain layer and the second source/drain layer. Then, a dopant source layer may be formed on surfaces of the first source/drain layer and the second source/drain layer, and dopants may be driven by, for example, annealing, from the dopant source layer into the active regions via the first source/drain layer and the second source/drain layer. The sacrificial gates may prevent the dopants from directly moving into the channel layer. However, some of the dopants may move into end portions of the channel layer close to the first source/drain layer and the second source/drain layer through the first source/drain layer and the second source/drain layer. If the first device and the second device are of different conductivity types, they may be doped respectively.

The gate stacks for the first device and the second device may be formed in the respective recesses of the respective channel layers of the first device and the second device, respectively. If the first device and the second device are of different conductivity types and are formed with different gate stacks respectively, the gate stacks thereof may be formed sequentially. In forming a second gate stack, a gate conductor layer in this gate stack can be used to form respective gate contact pads of the first device and the second device. The gate contact pads may be formed by patterning the gate conductor layer.

The technology of the present disclosure can be implemented in various ways, some of which are exemplified in the following with reference to the drawings.

FIGS. 1-19 are schematic views showing a flow of manufacturing a semiconductor device according to an embodiment of the present disclosure. In the following description, a scenario where an n-type device and a p-type device are formed respectively is described by way of example to show how devices of different conductivity types are formed in more detail. It should be understood that it is of course possible to form devices of the same conductivity type.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description. Here, a p-type silicon wafer is provided as the substrate 1001. In the substrate 1001, an n-type well region 1001w may be formed by ion implantation. A p-type device may be formed on the n-type well region 1001w (which is thus referred to as a p-type device region), and an n-type device may be formed on other regions of the p-type Si substrate 1001 (which is thus referred to as an n-type device region).

On the substrate 1001, a first source/drain layer 1031, a channel layer 1003 and a second source/drain layer 1005 may be formed in sequence by, for example, epitaxy. As an example, the first source/drain layer 1031 may comprise SiGe (with an atomic percentage of Ge being about 10-40%), with a thickness of about 20-50 nm; the channel layer 1003 may comprise Si, with a thickness of about 10-100 nm; the second source/drain layer 1005 may comprise SiGe (with an atomic percentage of Ge being about 10-40%), with a thickness of about 20-50 nm. SiGe has a greater lattice constant than Si, without being strained. The materials for the first source/drain layer 1031, the channel layer 1003 and the second source/drain layer 1005 are not limited thereto. Other semiconductor materials are also possible as long as they can provide appropriate etching selectivity. For example, the channel layer 1003 may comprise a semiconductor material, with the same components as the first source/drain layer 1031 and the second source/drain layer 1005, but with different contents of the components (for example, they all comprise SiGe, but with different atomic percentages of Ge), as long as the channel layer 1003 has etching selectivity with respect to the underlying first source/drain layer 1031 and the overlying second source/drain layer 1005. Further, the first source/drain layer 1031 and the second source/drain layer 1005 may comprise Si:C (with an atomic percentage of C being about 0.1-5%), while the channel layer 1003 may comprise Si. Si:C has a smaller lattice constant than Si, without being strained.

Figure 2A:
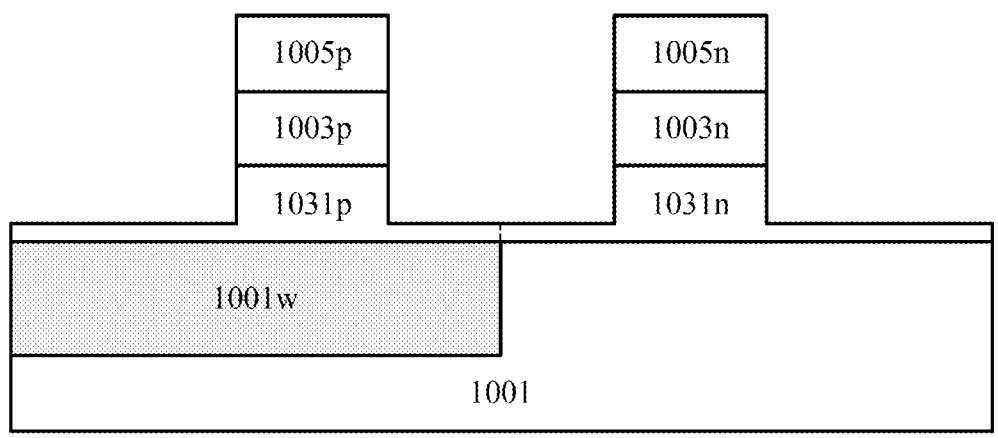
Figure 2B:
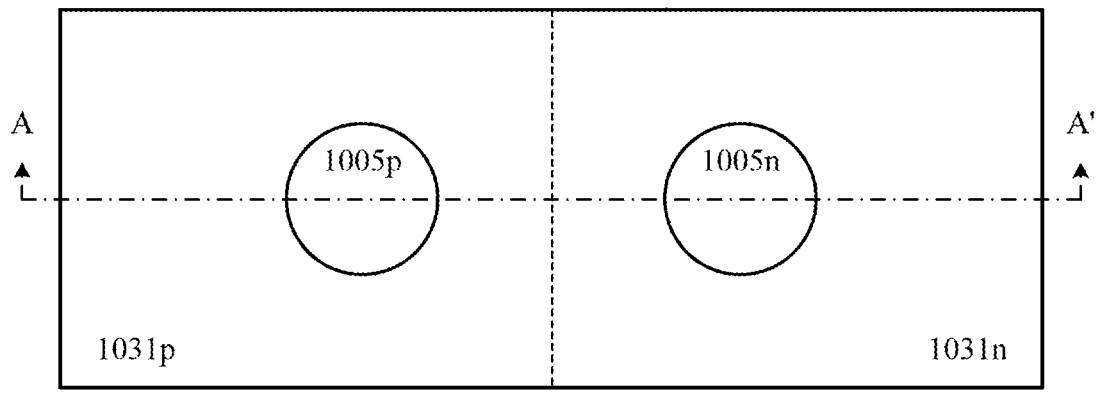

Next, active regions can be defined for the devices. For example, this can be done as follows. Specifically, as shown in FIGS. 2(a) and 2(b) (FIG. 2(a) is a sectional view, and FIG. 2(b) is a top view with line AA' indicating the location where the sectional view is taken), photoresist (not shown) may be formed on the stack of the first source/drain layer 1031, the channel layer 1003 and the second source/drain layer 1005 shown in FIG. 1, and then patterned into a desired shape (a substantially circular shape in this example) by photolithography (exposing and developing), and the second source/drain layer 1005, the channel layer 1003 and the first source/drain layer 1031 may be selectively etched by, for example, Reactive Ion Etching (RIE), in sequence with the patterned photoresist as a mask. The etching goes into the first source/drain layer 1031, but stops before reaching a bottom surface of the first source/drain layer 1031 for convenience of subsequent manufacturing of contacts. Then, the second source/drain layer 1005, the channel layer 1003 and an upper portion of the first source/drain layer 1031 are in a pillar shape (a cylindrical shape in this case) after being etched. The RIE may be performed in, for example, a direction substantially perpendicular to a surface of the substrate, and thus the pillar shape extends in the direction substantially perpendicular to the substrate surface. After that, the photoresist may be removed.

In this example, the active regions for the p-type device and the n-type device are patterned respectively in the p-type device region and the n-type device region. Here, for convenience of description, the first source/drain layer, the channel layer and the second source/drain layer for the p-type device are denoted as 1031p, 1003p and 1005p respectively, and the first source/drain layer, the channel layer and the second source/drain layer for the n-type device are denoted as 1031n, 1003n and 1005n respectively. In this stage, the first source/drain layer 1031 is continuous between the p-type device region and the n-type device region, and FIG. 2(a) schematically shows a boundary between the p-type device region and the n-type device region by a dashed line.

In the following description, when the p-type device region and the n-type device region are described together, reference numerals such as 1031, 1003, and 1005 are used; and when the p-type device region and the n-type device region need to be described respectively, reference numerals such as 1031p, 1003p and 1005p, and 1031n, 1003n and 1005n are used, respectively.

In this example (a stack of SiGe-Si-SiGe), Si is strained after the RIE, because SiGe has a greater lattice constant than Si without being strained. The strain will cause the mobility of holes in Si become greater than that if without the strain, or cause the effective mass of light holes in Si become smaller than that if without the strain, or cause the concentration of light holes in Si become greater than that if without the strain, so that the p-type device will have an increased ON current and thus has its performances improved.

Alternatively, in a case of a stack of Si:C—Si—Si:C, Si is strained after the RIE, because Si:C has a smaller lattice constant than Si, without being strained. The strain will cause the mobility of electrons in Si become greater than that if without the strain, or cause the effective mass of electrons in Si become smaller than that if without the strain, so that the n-type device will have an increased ON current and thus has its performances improved.

Further, if SiGe is selected to be used as the material for the channel layer and Si is selected to be used as the material for the source/drain layers, this selection will result in an increased ON current and a reduced OFF current for the p-type device, so that the p-type device's performances are improved. This is because Si has a forbidden band gap greater than that of SiGe, and the mobility of holes in SiGe is higher than that in Si.

Figure 3:
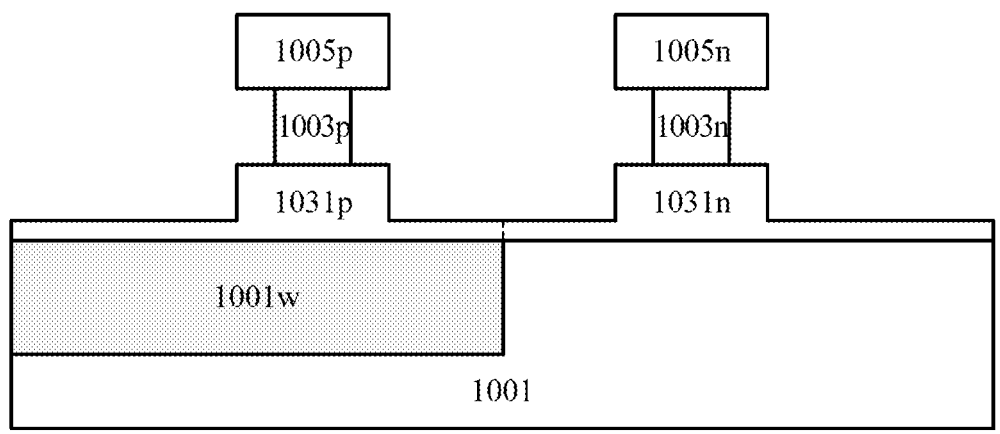

Then, as shown in FIG. 3, a periphery of the channel layer 1003 may be recessed (in this example, in a lateral direction substantially parallel to the substrate surface) with respect to peripheries of the first source/drain layer 1031 and the second source/drain layer 1005. Upper and lower sidewalls of the recess are defined by interfaces between the channel layer 1003 and the second source/drain layer 1005 and between the channel layer 1003 and the first source/drain layer 1031, respectively. For example, this can be done by selectively etching (for example, isotropic etching, such as wet etching using TMAH solution) the channel layer 1003 further with respect to the first source/drain layer 1031 and the second source/drain layer 1005. For example, selective etching may be performed using Atomic Layer Etching (ALE) or digital etching. For example, surfaces of the first source/drain layer 1031, the channel layer 1003 and the second source/drain layer 1005 are oxidized by thermal treatment and respective surface oxide layers thereof are then removed. In a case that the channel layer 1003 is SiGe and the first source/drain layer 1031 and the second source/drain layer 1005 are Si, oxidation of SiGe is faster than that of Si, and the oxide on SiGe is easier to be removed. Those steps of oxidation and oxide removing can be repeated to achieve the desired recess. In this way, it is possible to well control the recess as compared to the conventional selective etching.

Thus, the active region is defined (i.e., the first source/drain layer 1031, the channel layer 1003 and the second source/drain layer 1005, after being etched). In this example, the active region is substantially in a pillar shape. In the active region, the upper portion of the first source/drain layer may have its periphery substantially aligned with that of the second source/drain layer 1005, while the periphery of the channel layer 1003 is relatively recessed. The upper and lower sidewalls of the recess are defined by the interfaces between the channel layer 1003 and the second source/drain layer 1005 and between the channel layer 1003 and the first source/drain layer 1031, respectively.

Certainly, the active region is not limited to the specific shape illustrated, but can be formed in different shapes according to design layout. For example, the active region may be in an ellipse, a square, a rectangle, or the like in the top view.

Figure 4:
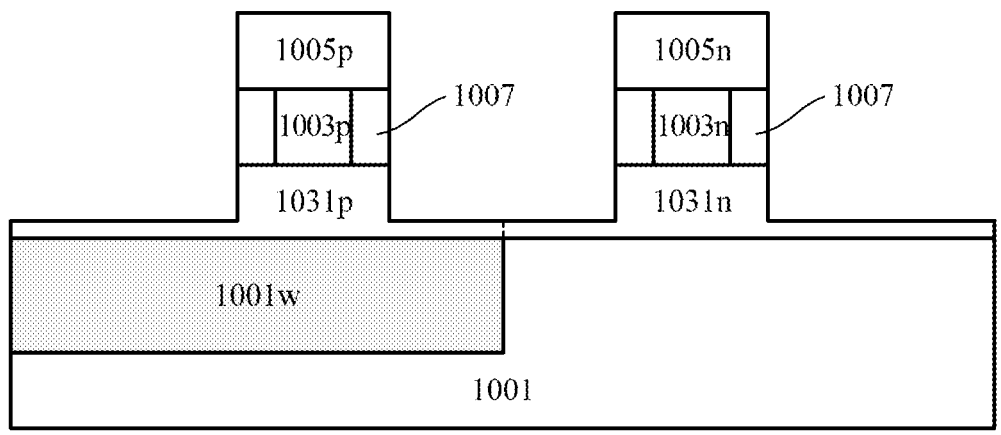

In the recess which is formed by the channel layer 1003 with respect to the upper portion of the first source/drain layer 1031 and the periphery of the second source/drain layer 1005, a gate stack will be formed later. To prevent the following process from impacting the channel layer 1003 or leaving some unwanted material(s) in this recess which will impede the formation of the gate stack, a material layer may be filled in the recess to occupy the space for the gate stack (and thus, this material layer may be referred to as a "sacrificial gate"). For example, this can be done by depositing nitride on the structure shown in FIG. 3 and then etching the deposited nitride back by, for example, RIE. The RIE may be performed in a direction substantially perpendicular to the substrate surface, so that the nitride can be left only within the recess, resulting in the sacrificial gate 1007, as shown in FIG. 4. In this case, the sacrificial gate 1007 may substantially fill the recess up.

Figure 5:
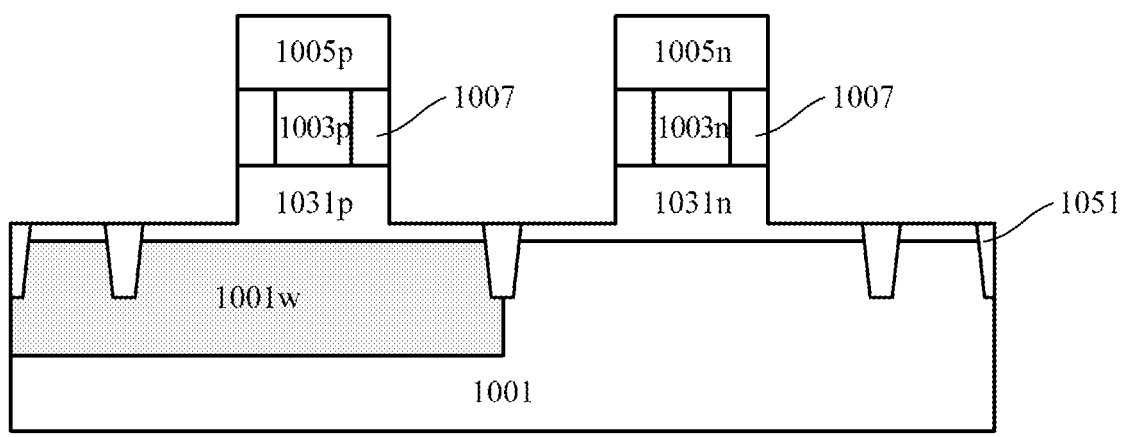

In addition, Shallow Trench Isolation (STI) may further be made. For example, STI 1051 may be formed by etching a trench where isolation is required and then filling the trench with oxide, as shown in FIG. 5. Those skilled in the art will recognize a variety of STI processes, which will not be described in detail here. The STI 1051 may be disposed around the active region of the p-type device and the active region of the n-type device, respectively.

Next, source/drain regions may be formed in the first source/drain layer 1031 and the second source/drain layer 1005. The source/drain regions may be formed by doping the first source/drain layer 1031 and the second source/drain layer 1005. For example, this may be done as follows.

Figure 6:
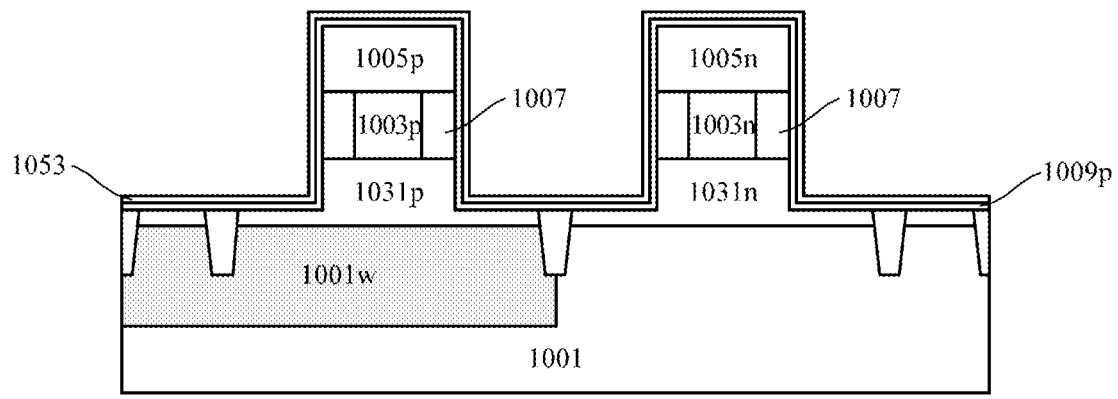

Specifically, as shown in FIG. 6, a p-type dopant source layer 1009*p* may be formed on the structure shown in FIG. 5. For example, the p-type dopant source layer 1009*p* may comprise oxide such as silicon oxide, containing p-type dopants such as B therein. Here, the dopant source layer 1009*p* may be a thin film, with a thickness of about 2-10 nm, and can be deposited in a substantially conformal manner on a surface of the structure shown in FIG. 5 by, for example, Chemical Vapor Deposition (CVD) or Atom Layer Deposition (ALD) etc.

In addition, in order to avoid cross-contamination with an n-type dopant source layer which is to be formed, a diffusion barrier layer 1053 may be formed on the p-type dopant source layer 1009*p*. For example, the diffusion barrier layer 1053 may include nitride, oxynitride, oxide etc., with a thickness of about 0.5-5 nm.

Figure 7:
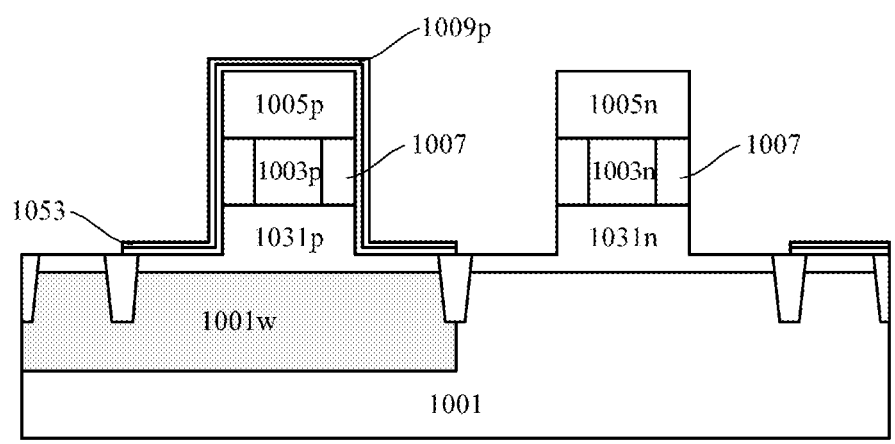

Then, the p-type dopant source layer 1009*p* (and the diffusion barrier layer 1053) may be patterned (by, for example, photolithography) as shown in FIG. 7, to remain in a region where p-type doping is required. In this example, the p-type dopant source layer 1009*p* may remain in the p-type device region (because the source/drain layers thereof require p-type doping) and a region where body contact is to be formed (if any, because a p-type body contact region may be formed for the n-type device) in the n-type device region.

Figure 8:
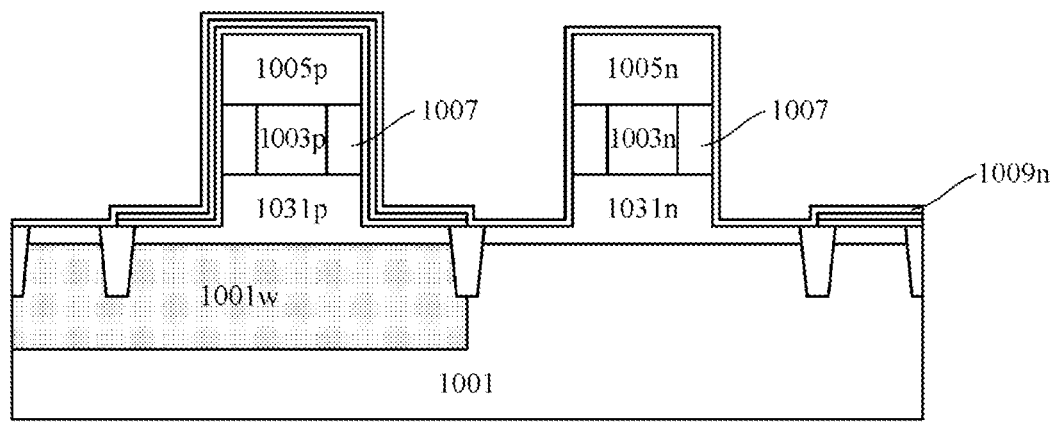

Next, as shown in FIG. 8, the n-type dopant source layer 1009*n* may be formed on the structure shown in FIG. 7. For example, the n-type dopant source layer 1009*n* may include oxide containing n-type dopants such as As or P, with a thickness of about 2-10 nm. The n-type dopant source layer 1009*n* may be formed in the same manner as the p-type dopant source layer 1009*p*. The n-type dopant source layer 1009*n* may cover a region in which n-type doping is required, such as the n-type device region (because the source/drain layers thereof require n-type doping) and a region where body contact is to be formed (if any, because an n-type body contact region may be formed for the p-type device) in the p-type device region.

Optionally, another diffusion barrier layer may be formed on the n-type dopant source layer 1009*n* to suppress outward diffusion or cross-contamination.

Figure 9:
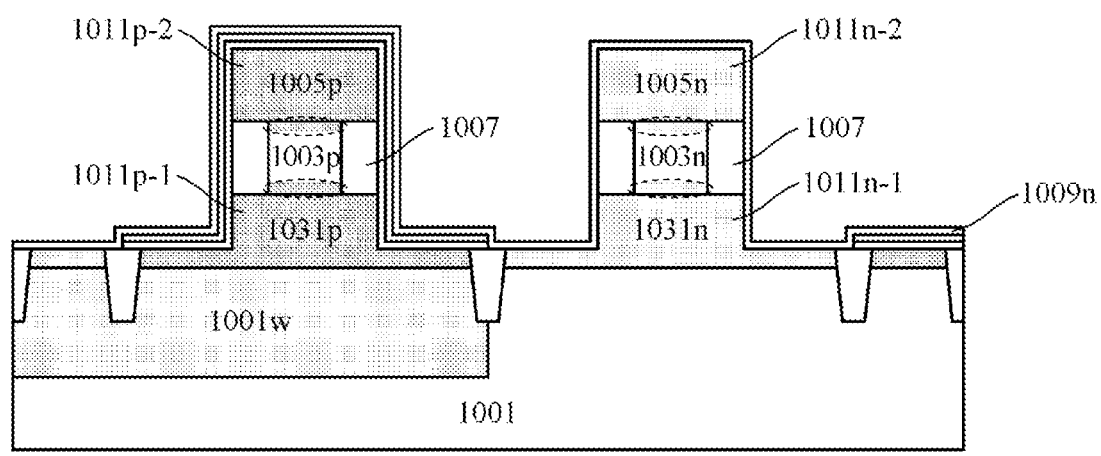

Next, as shown in FIG. 9, dopants included in the dopant source layers 1009*p* and 1009*n* may be driven into the active regions by, for example, annealing at about 800-1100° C., so that doped regions are formed therein, as indicated by shadowed regions in the figure. More specifically, in the p-type device region, one of the source/drain regions of the p-type device 1011*p*-1 may be formed in the first source/drain layer 1031*p* and the other 1011*p*-2 may be formed in the second source/drain layer 1005*p*. Similarly, in the n-type device region, one of the source/drain regions of the n-type device 1011*n*-1 may be formed in the first source/drain layer 1031*n* and the other 1011*n*-2 may be formed in the second source/drain layer 1005*n*. After that, the dopant source layers 1009*p* and 1009*n* and the diffusion barrier layer 1053 may be removed.

Further, in spite of the sacrificial gate 1007, the dopants may also go into the channel layer 1003 via the first source/drain layer 1031 and the second source/drain layer 1005, so that the channel layer 1003 may have its top and bottom ends with some doping distribution (from which, an extension region is formed, for example), as indicated by dashed ellipses in the figure. Such doping distribution helps to reduce the resistance between the source/drain regions when the device is ON, resulting in improved device performances.

In the above example, the source/drain regions are formed by driving the dopants from the dopant source layer to the active region. However, the present disclosure is not limited thereto. For example, the source/drain regions may be formed by ion implantation, plasma doping (for example, conformal doping along a surface of the structure in FIG. 5), etc. Of course, this can be done respectively for the region where p-type doping is required and the region where n-type doping is required. When a region is being processed, the other region may be masked with, for example, photoresist. This localized processing is common in CMOS processes. In addition, if devices of the same conductivity type are to be formed, the source/drain layers may be doped in site while being grown.

In the above example, the p-type dopant source layer 1009*p* is formed firstly, and then the n-type dopant source layer 1009n is formed. However, the present disclosure is not limited thereto and their orders may be interchanged.

Figure 27:
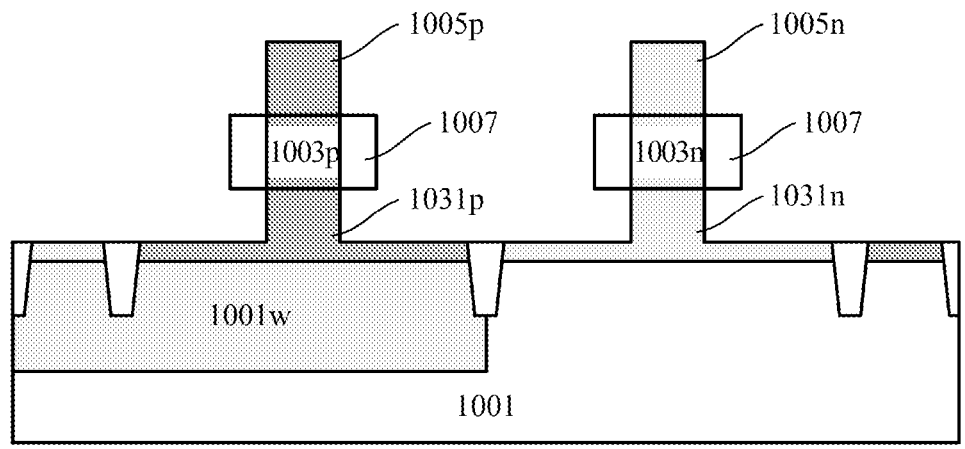
FIGS. 27 and 28 show a process of thinning a source/drain layer according to an embodiment of the present disclosure.
Figure 28:
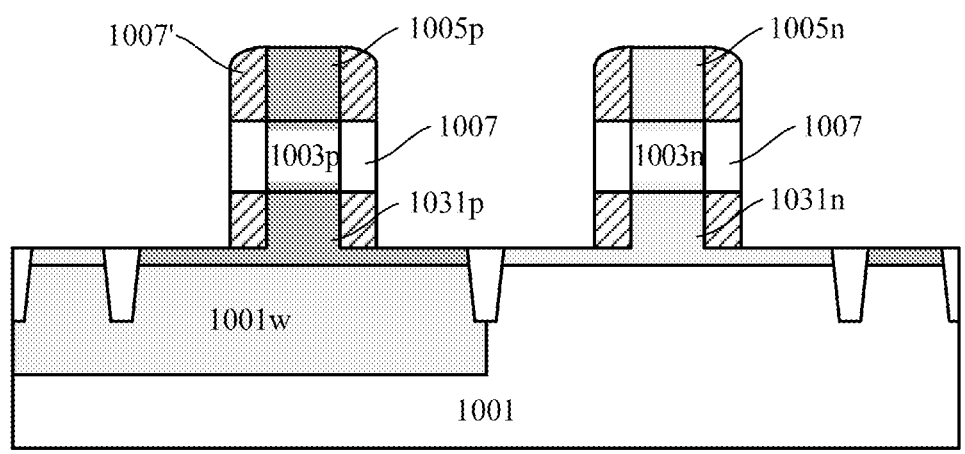

In addition, in order to reduce capacitance between the source/drain and the gate, the source/drain layers may further be thinned and partially replaced with low-k dielectric. For example, as shown in FIG. 27, the source/drain layers may be selectively etched in the structure shown in FIG. 9 (with the dopant source layer and the diffusion barrier layer removed) to become thinner (perhaps even thinner than the channel layer). After that, as shown in FIG. 28, a low-k dielectric spacer 1007' may be formed with low-k dielectric by a spacer formation process.

In addition, in order to reduce the contact resistance, a silicidation process may be performed on the source/drain layers. For example, a layer of NiPt (for example, with a Pt content of about 2-10%, a thickness of about 2-10 nm) may be deposited on the structure shown in FIG. 9 (with the dopant source layers and the diffusion barrier layer removed, or after the source/drain layers are thinned and before the low-k dielectric spacer 1007' is formed), and annealing may be performed at a temperature of about 200-400° C., so that NiPt reacts with Si to produce SiNiPt. After that, unreacted residual NiPt may be removed.

Figure 10:
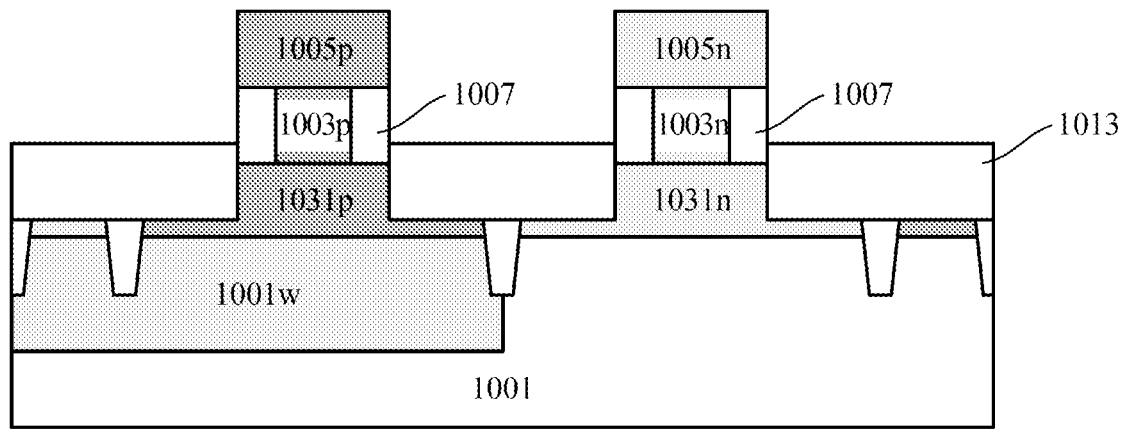

Next, a gate stack may be formed. In order to reduce the overlap between the gate stack and the source/drain layers, a dielectric layer may be formed around the active region to block the underlying source/drain layer 1031. For example, as shown in FIG. 10, oxide may be deposited on the structure shown in FIG. 9 (or on the structure shown in FIG. 28 in a case that the source/drain layer is thinned) and is etched back to form a dielectric layer 1013. Before the back etching, the deposited oxide may be planarized by, for example, Chemical Mechanical Polishing (CMP) or sputtering. Here, a top surface of the dielectric layer 1013 may be located at a level between top and bottom surfaces of the channel layer 1003, which facilitates the formation of a self-aligned gate stack, which will be described in further detail below.

When the dielectric layer is being formed, the sacrificial gate 1007 may remain to prevent the material of the dielectric layer from going to the recess in which the gate stack is to be accommodated. After that, the sacrificial gate 1007 may be removed to release the space in the recess. For example, the sacrificial gate 1007 (nitride) may be selectively etched with respect to the dielectric layer 1013 (oxide), the second source/drain layer 1005 (SiGe) and the channel layer 1003 (Si).

Figure 11:
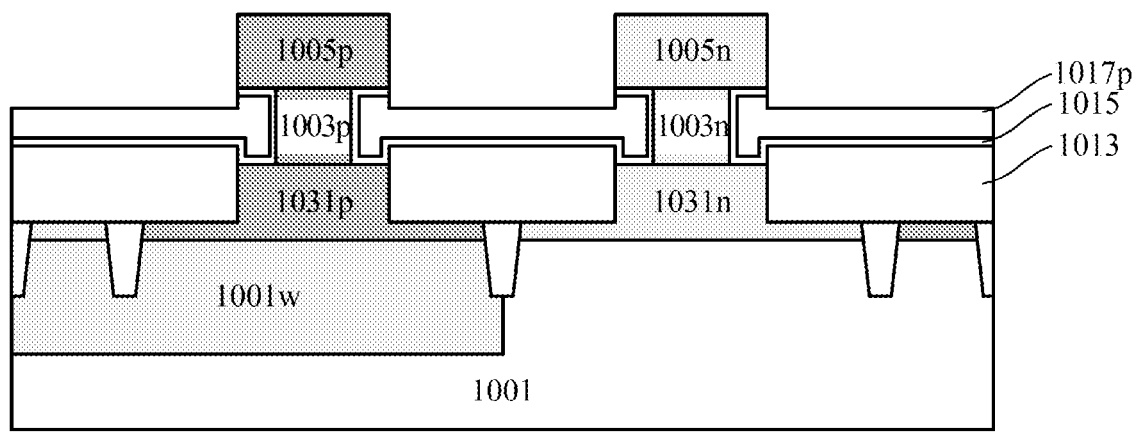

Then, as shown in FIG. 11, the gate stack may be formed in the recess. Here, different gate stacks may be formed for the p-type device and the n-type device, respectively. In the following description, a scenario where the gate stack of the p-type device is firstly formed is described by way of example. However, the present disclosure is not limited thereto, and for example, the gate stack of the n-type device may be formed firstly.

Specifically, a gate dielectric layer 1015 and a gate conductor layer 1017p for the p-type device may be deposited in sequence on the structure shown in FIG. 10 (with the sacrifice gate 1007 removed), and the deposited gate conductor layer 1017p (and optionally the gate dielectric layer 1015) may be etched back so that a portion thereof outside the recess has its top surface at a level not higher than and preferably lower than the top surface of the channel layer 1003. For example, the gate dielectric layer 1015 may include high K gate dielectric such as $HfO_2$; and the gate conductor layer 1017p may include a metal gate conductor. Further, a work function adjustment layer may further be formed between the gate dielectric layer 1015 and the gate conductor layer 1017p. An interfacial layer of, for example, oxide, may be formed before the formation of the gate dielectric layer 1015.

Due to the arrangement of the top surface of the dielectric layer 1013, the gate stack overlaps with only a side face of the channel layer 1003 in the vertical direction, and does not overlap with respective side faces of the first source/drain layer and the second source/drain layer in the vertical direction. That is, the gate stack is self-aligned with the channel layer 1003. In this way, the gate stack may be embedded into the recess, and thus overlap with an entire height of the channel layer 1003.

Figure 12:
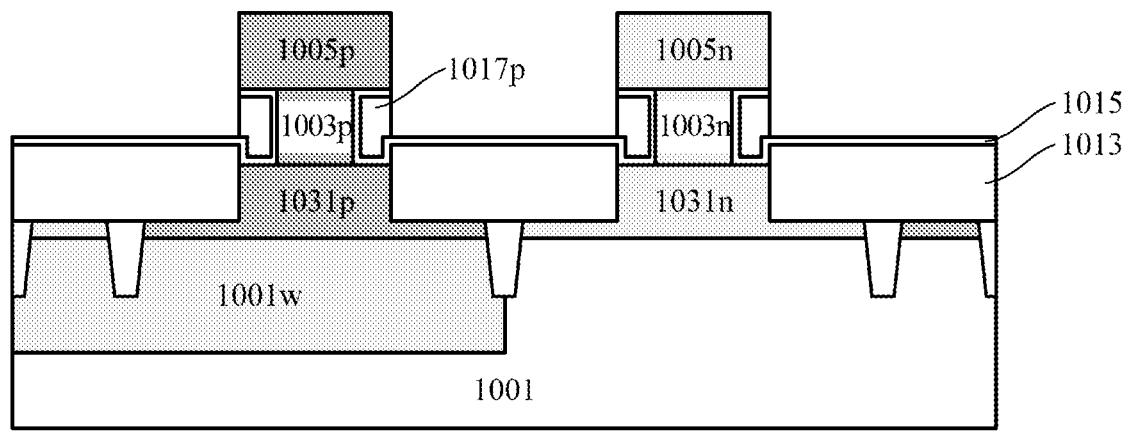
Figure 13:
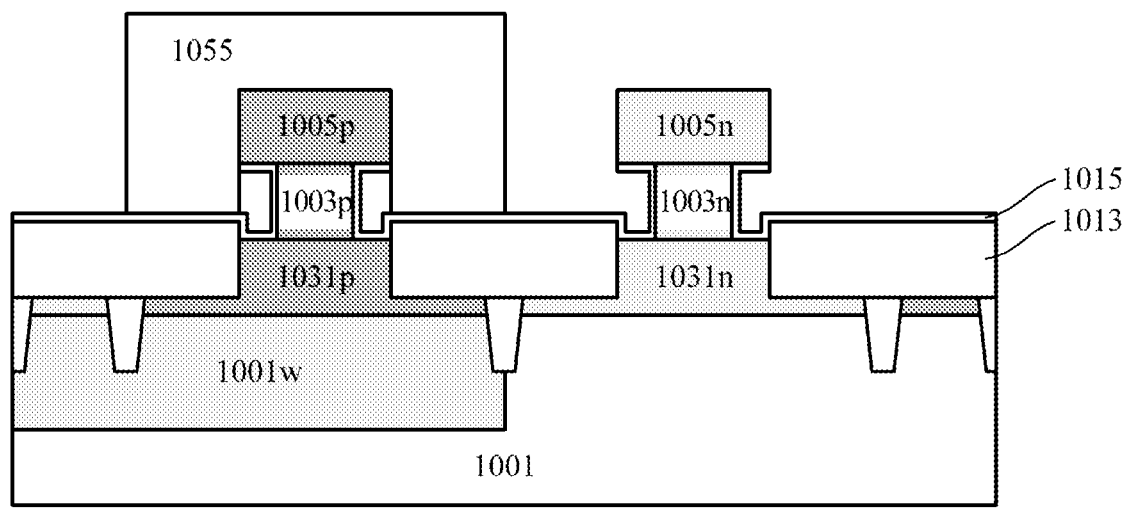

Then, as shown in FIG. 12, the gate conductor layer 1017p may be selectively etched by, for example, RIE. The etching may be performed with the active region, especially the second source/drain layer at the top end as a mask. For example, RIE may be performed in a direction substantially perpendicular to the substrate surface, so that the gate conductor layer 1017p may remain only in the recess. The etching may be stopped at the gate dielectric layer 1015. Then, as shown in FIG. 13, the gate conductor layer 1017p (which is currently within the recess) in the p-type device region may be covered with, for example, photoresist 1055, and the gate conductor layer 1017p in the n-type device region is exposed. After that, the gate conductor layer 1017p in the n-type device region may be removed by selective etching such as wet etching. Thus, a gate stack (1015/1017p) for the p-type device is formed, and is embedded in the recess of the channel layer 1003p of the p-type device.

Figure 14:
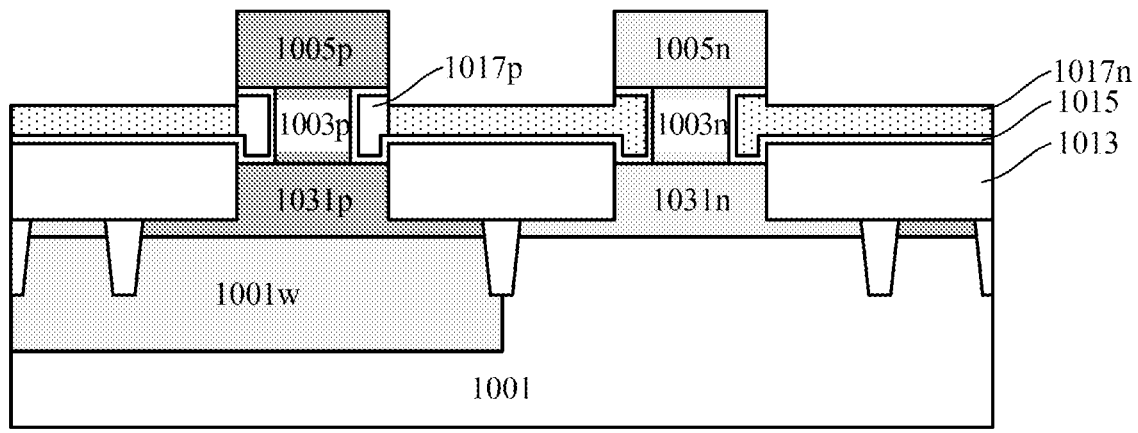

Next, a gate stack for the n-type device may be formed. The gate stack of the n-type device may also be similarly formed. For example, as shown in FIG. 14, a gate conductor layer 1017n for the n-type device may be formed. For example, the gate conductor layer 1017n may be deposited on the structure shown in FIG. 13 (with the photoresist 1055 removed), and the deposited gate conductor layer 1017n may be etched back so that a portion thereof outside the recess has its a top surface at a level not higher and preferably lower than the top surface of the channel layer 1003. For example, the gate conductor layer 1017n may include a metal gate conductor. In addition, a work function adjustment layer may be formed between the gate dielectric layer 1015 and the gate conductor layer 1017n. In this example, the n-type device and the p-type device may share the same gate dielectric layer 1015. Of course, the present disclosure is not limited thereto. For example, the gate dielectric layer 1015 may be removed, and another gate dielectric layer may be formed for the n-type device. As the channel layer 1003n of the n-type device and the channel layer 1003p of the p-type device are simultaneously formed through film growth and selective etching, an upper surface of the channel layer 1003n of the n-type device and an upper surface of the channel layer 1003p of the p-type device are substantially co-planar, and a lower surface of the channel layer 1003n of the n-type device and a lower surface of the channel layer 1003p of the p-type device are substantially co-planar.

Thus, the gate conductor layer 1017n is formed not only in the n-type device region but also in the p-type device region and is in contact with the gate conductor layer 1017p. After that, a gate contact pad may be formed using the gate conductor layer 1017n, for convenience of making a contact of the gate later.

Of course, the manner in which the gate stack is formed is not limited thereto. For example, after the formation of the gate stack for the p-type device, the p-type device region may be covered with photoresist and a portion of the gate conductor layer 1017*p* in the n-type device region is removed by selective etching such as RIE. The gate stack for the n-type device may then be formed in the n-type device region (with, for example, the photoresist still remaining to cover the p-type device region).

Figure 15A:
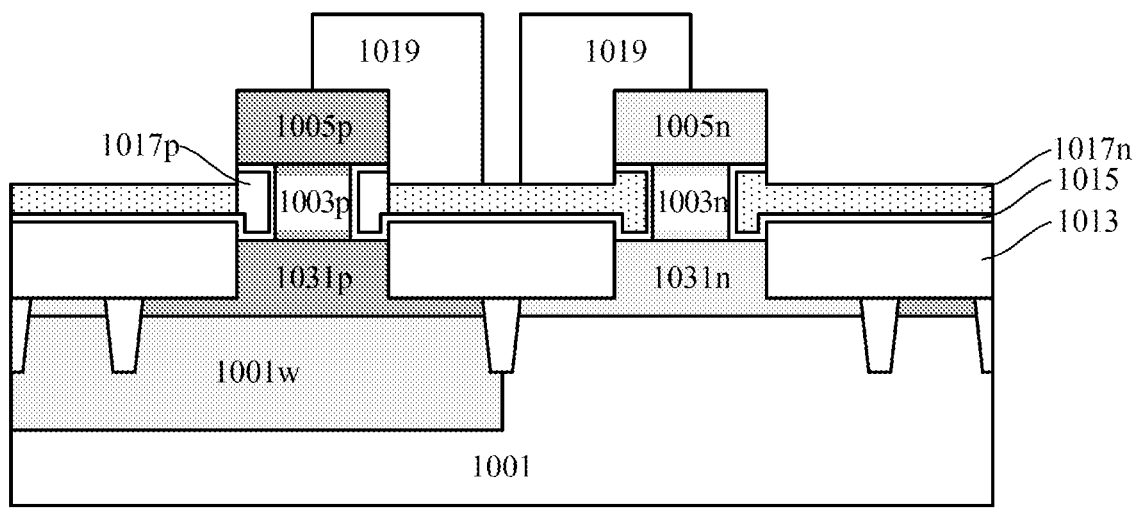
Figure 15B:
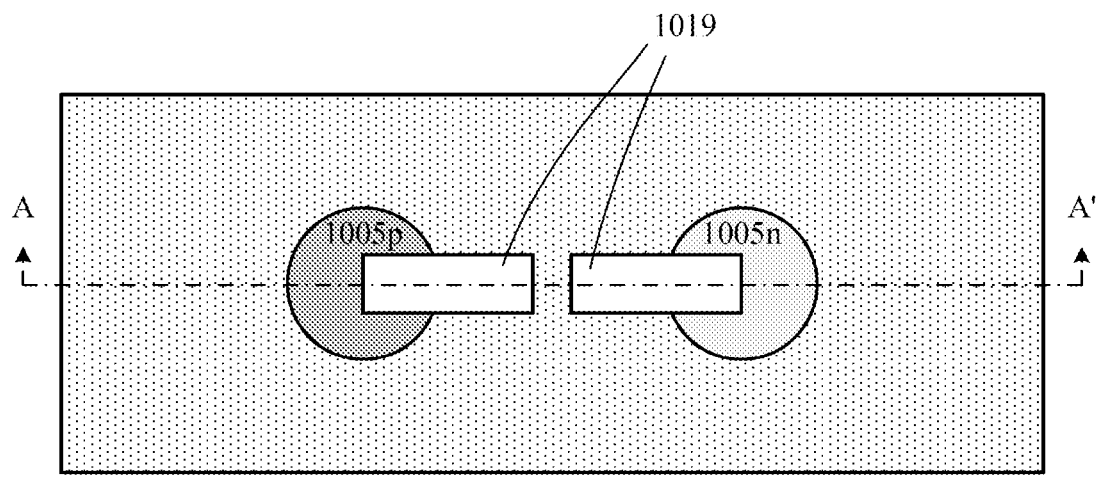

Next, the gate conductor layer 1017*n* may be patterned to form the gate contact pad to facilitate manufacturing of contacts later. For example, as shown in FIGS. 15(*a*) and 15(*b*) (FIG. 15(*a*) is a sectional view, and FIG. 15(*b*) is a top view with line AA' indicating the location where the sectional view is taken), photoresist 1019 may be formed on the structure shown in FIG. 14. The photoresist 1019 is patterned, for example, by photolithography to cover one portion of the gate conductor layer 1017*n* outside the recess while exposing another portion of the gate conductor layer 1017*n* outside the recess. In this example, as shown in FIG. 15(*b*), the photoresist 1019 may comprise strips extending outwards in certain directions from peripheries of the respective active regions in the p-type device region and the n-type device region, respectively. For convenience of patterning, the photoresist strips on the p-type device region and the n-type device region are substantially aligned with each other.

Figure 16:
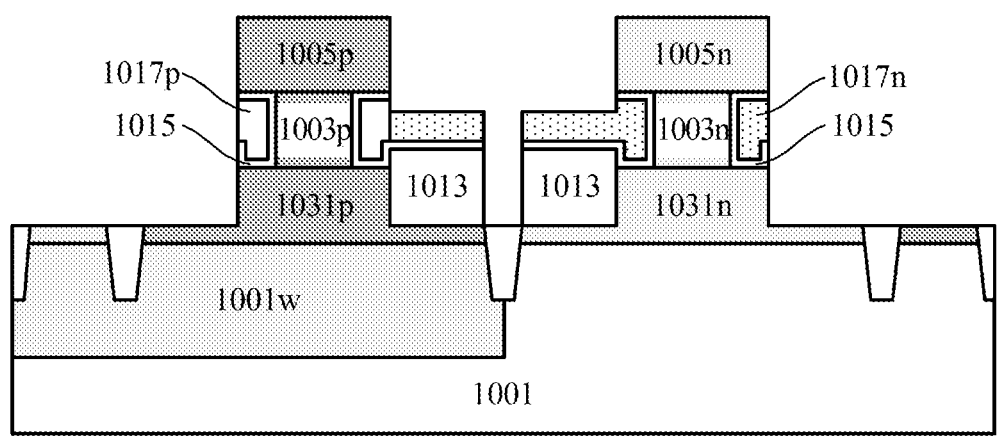

Then, as shown in FIG. 16, the gate conductor layer 1017*n* may be selectively etched by, for example, RIE, with the photoresist 1019 as a mask. In this way, in addition to a portion of the gate conductor layer 1017*n* which remains in the recess, the portion of the gate conductor layer 1017*n* which is covered by the photoresist 1019 is left and serves as the gate contact pad. Later, an electrical connection to the gate stack may be achieved by the gate contact pad.

According to another embodiment, further processes may be performed to expose the surfaces of the first source/drain layer 1031 and the second source/drain layer 1005 (actually the surface of the second source/drain layer 1005 has already been exposed), in particular upper surfaces on which a contact is to be formed. To do this, the gate dielectric layer 1015 and the isolation layer 1013 may be selectively etched, by, for example, RIE. The RIE may be performed in a direction substantially perpendicular to the substrate surface. Thus, the upper surface of the first source/drain layer 1031 except for a portion thereof remaining below the gate stack is exposed. After that, the photoresist 1019 may be removed.

Figure 17:
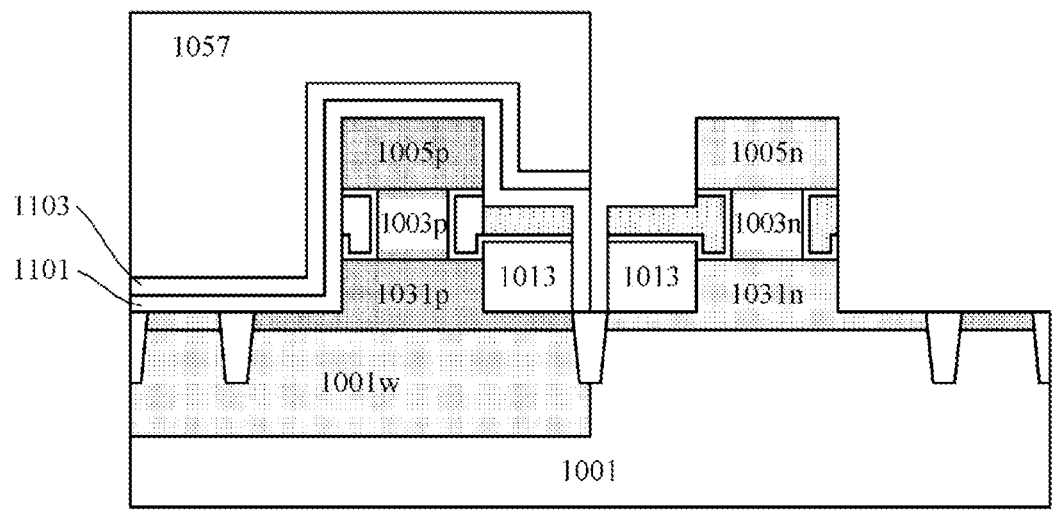

Then, dielectric films (for example, stressed liners) may be formed on the surfaces of the active regions (particularly the source/drain layers) of the p-type device and the n-type device, respectively. For example, as shown in FIG. 17, a stressed liner 1101 for the p-type device may be formed on the structure shown in FIG. 16. For example, the stressed liner 1101 may be formed by depositing a nitride layer in a substantially conformal manner. The stressed liner 1101 may have a thickness of about 10-50 nm and may be tensile stressed to create compressive stress in the channel layer. In addition, an etching stopper layer 1103 of, for example, oxide, may be formed on the stressed liner 1101. Then, photoresist 1057 which covers the p-type device region may be formed, and the etching stopper layer 1103 and the stress liner 1101 may be selectively etched by, for example, RIE, with the photoresist 1057 as a mask, to remain in the p-type device region. After that, the photoresist 1057 may be removed.

Figure 18:
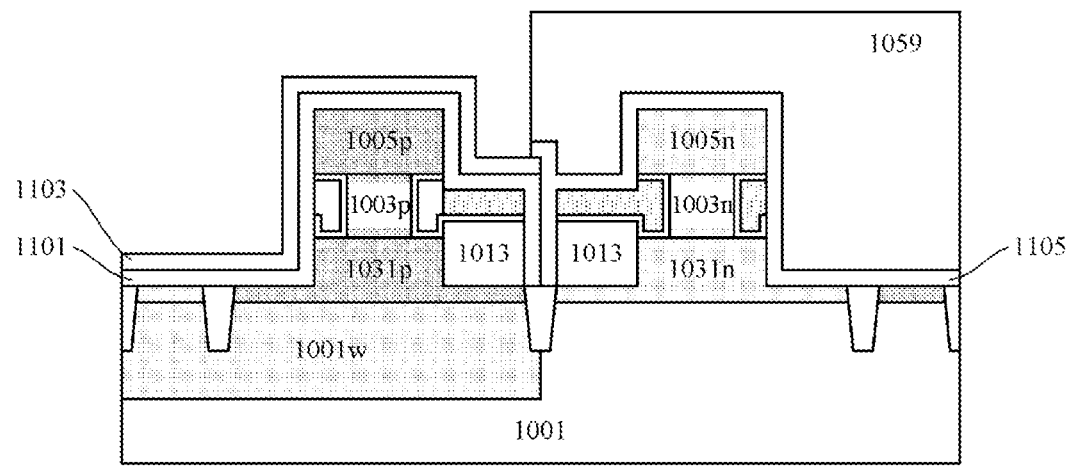

In addition, a stressed liner 1105 may be formed in the n-type device region in a similar manner. For example, as shown in FIG. 18, the stressed liner 1105 for the n-type device may be formed on the structure shown in FIG. 17. For example, the stressed liner 1105 may be formed by depositing a nitride layer in a substantially conformal manner. The stressed liner 1105 may have a thickness of about 10-50 nm and may be compressive stressed to create tensile stress in the channel layer. Then, photoresist 1059 which covers the n-type device region may be formed, and the stressed liner 1105 may be selectively etched by, for example, RIE, with the photoresist 1059 as a mask, to remain in the n-type device region. The RIE may be stopped at the etching stopper layer 1103. After that, the photoresist 1059 may be removed.

Thus, the respective stressed liners are formed in the p-type device region and the n-type device region, respectively, and the order of making those liners may be interchanged. As shown, the stressed liner may cover the upper surface of the source/drain layer, thus protecting the active region and also acting as an etching stopper layer during etching of contact holes later.

Figure 19:
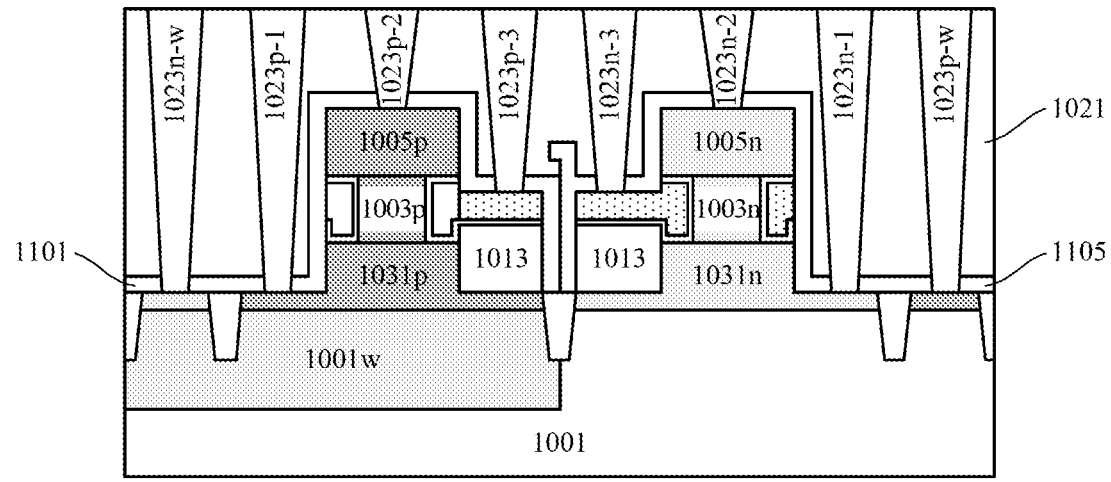

Then, as shown in FIG. 19, an interlayer dielectric layer 1021 may be formed on the structure shown in FIG. 18. For example, the interlayer dielectric layer 1021 may be formed by depositing oxide and then planarizing it by, for example, CMP. In FIG. 19, the etching stopper layer 1103 of oxide is integrally shown with the interlayer dielectric layer. In the interlayer dielectric layer 1021, for the p-type device region, a contact 1023*p*-1 to the source/drain region 1011*p*-1, a contact 1023*p*-2 to the source/drain region 1011*p*-2, a contact 1023*p*-3 to the gate conductor layer 1017, and a contact 1023*n*-*w* to the well region 1001*w* may be formed. Similarly, for the n-type device region, a contact 1023*n*-1 to the source/drain region 1011*n*-1, a contact 1023*n*-2 to the source/drain region 1011*n*-2, and a contact 1023*n*-3 to the gate conductor layer 1017 and a contact 1023*p*-*w* to the p-type substrate 1001 may be formed. These contacts may be formed by etching holes in the interlayer dielectric layer 1021 and the stress edliners and filling the holes with a conductive material such as metal (for example, tungsten). Before filling with metal, a barrier layer of, for example, TiN, may be formed on inner walls of the contact holes.

In etching the contact holes, etching of the interlayer dielectric layer 1021 may be stopped at the stressed liners, and then the stressed liners which have substantially uniform thickness may be etched. It is difficult for the contact holes to be etched because the contact to the source/drain region and the contact to the gate conductor layer have different heights. In the present embodiment, however, it is relatively easy to control the stop of the etching of the contact holes due to the presence of the stressed layers.

Due to the presence of the gate contact pad, it is relatively easy to make the contact to the gate. Further, because the doped region in the first source/drain layer extends beyond the active region and has at least a portion thereof not covered by the gate contact pad, it is relatively easy to make the contact thereto.

As shown in FIG. 19, the semiconductor device according to the present embodiment may include the p-type device and the n-type device each in a form of a vertical device. Each of the p-type device and the n-type device includes the first source/drain layer 1031, the channel layer 1003, and the second source/drain layer 1005 stacked vertically. The source/drain regions are formed in the first source/drain layer 1031 and the second source/drain layer 1005. The channel layer 1003 is laterally recessed and the gate stack is formed surrounding the periphery of the channel layer 1003 and is embedded in the recess. Each of the devices further includes the gate contact pad extending outwards from the gate conductor.

Figure 20:
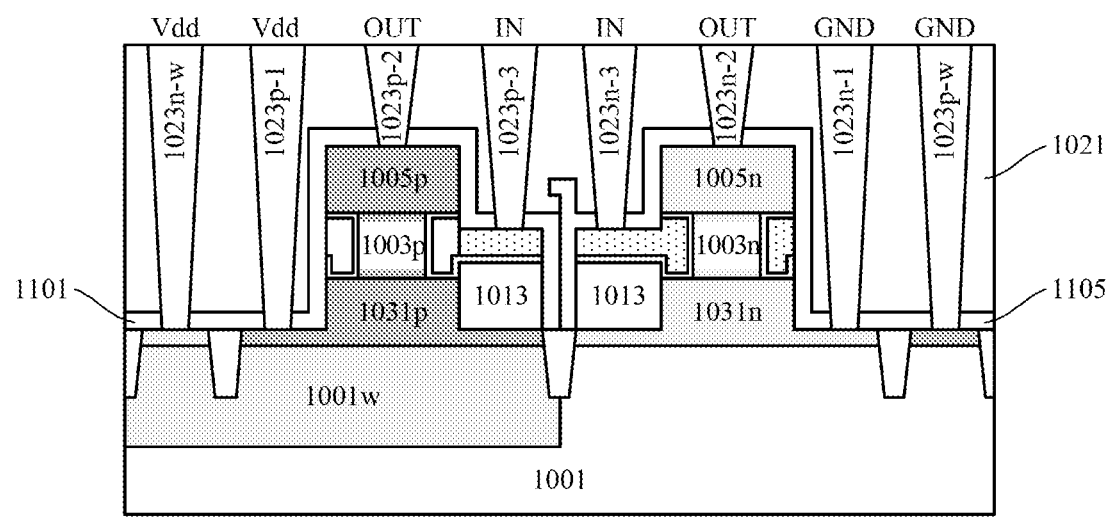
FIGS. 20 and 21 show connections of terminals of a semiconductor device in a CMOS configuration according to an embodiment of the present disclosure, respectively.
Figure 21:
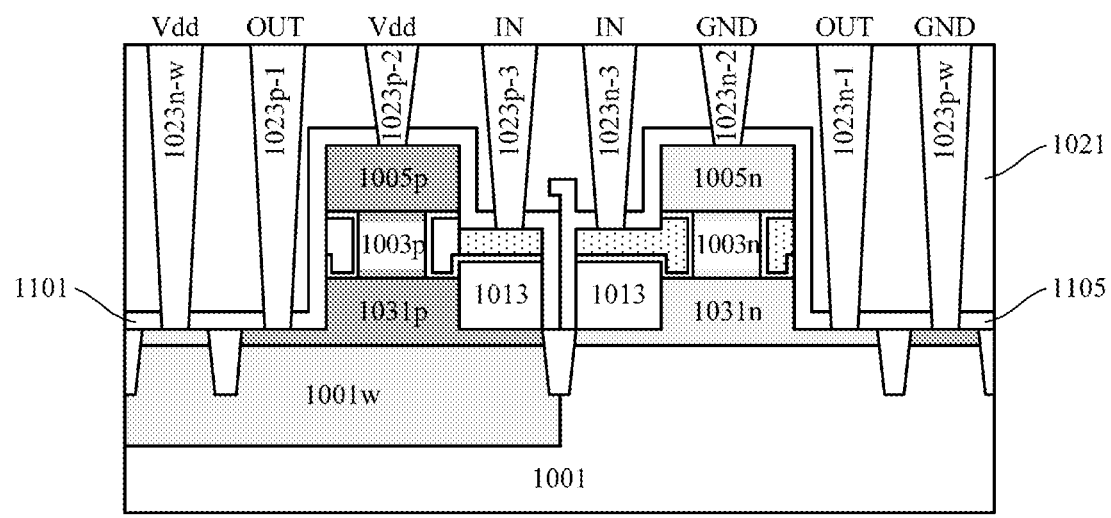

FIGS. 20 and 21 show connections of terminals of a semiconductor device in a CMOS configuration according to the present embodiment, respectively.

As shown in FIG. 20, for the p-type device, the first source/drain layer 1031p and the n-type well may be connected to a supply voltage Vdd, the gate may be connected to an input signal IN, and an output signal OUT may be outputted from the second source/drain layer 1005p. Similarly, for the n-type device, the first source/drain layer 1031n and the p-type substrate may be connected to a ground voltage GND (where Vdd is assumed to be greater than GND), the gate may be connected to the input signal IN, and the output signal OUT may be outputted from the second source/drain layer 1005n. In this connection, there is no junction leakage between the first source/drain layer and the well region (or the p-type substrate) in the p-type device region and the n device region. However, there may be junction leakage between the wells (between the n-type well region and the p-type substrate).

Alternatively, as shown in FIG. 21, connections of the first source/drain layer and the second source/drain layer shown in FIG. 20 may be interchanged. In this connection, although there may be junction leakage between the first source/drain layer and the well region (or the p-type substrate), an area can be saved in some cases because the n-type device and the p-type device can share contacts. This will be further described below.

FIGS. 22-25 are schematic views showing some stages in a flow of manufacturing a semiconductor device according to another embodiment of the present disclosure.

Figure 22:
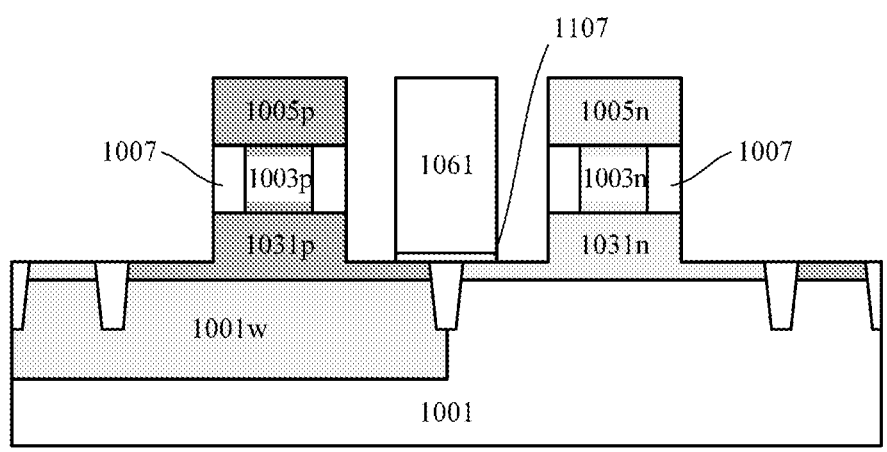
FIGS. 22-25 are schematic views showing some stages in a flow of manufacturing a semiconductor device according to another embodiment of the present disclosure.

After the formation of the source/drain regions and the removal of the dopant source layers and the diffusion barrier layer as described above in connection with FIG. 9, as shown in FIG. 22, a conductive bridge 1107 may be formed between the p-type device region and the n-type device region. For example, a conductive material layer of, for example, metal may be deposited on the structure shown in FIG. 9 (with the dopant source layers and the diffusion barrier layer removed). Then, photoresist 1061 is formed and patterned to cover a portion of the conductive material extending between the p-type device region and the n-type device region. After that, the conductive material may be selectively etched by, for example, RIE, with the photoresist 1061 as a mask, to obtain the conductive bridge 1107. The conductive bridge 1107 spans across the STI to electrically connect the first source/drain layer 1031p of the p-type device and the first source/drain layer 1031n of the n-type device.

Alternatively, a Si layer may be formed in the same manner as the conductive bridge 1107. Then, in a case of performing silicidation, the Si layer may be converted into conductive silicide and constitute the conductive bridge 1107.

Next, the process may be carried out in the same manner as in the above embodiments.

Figure 23A:
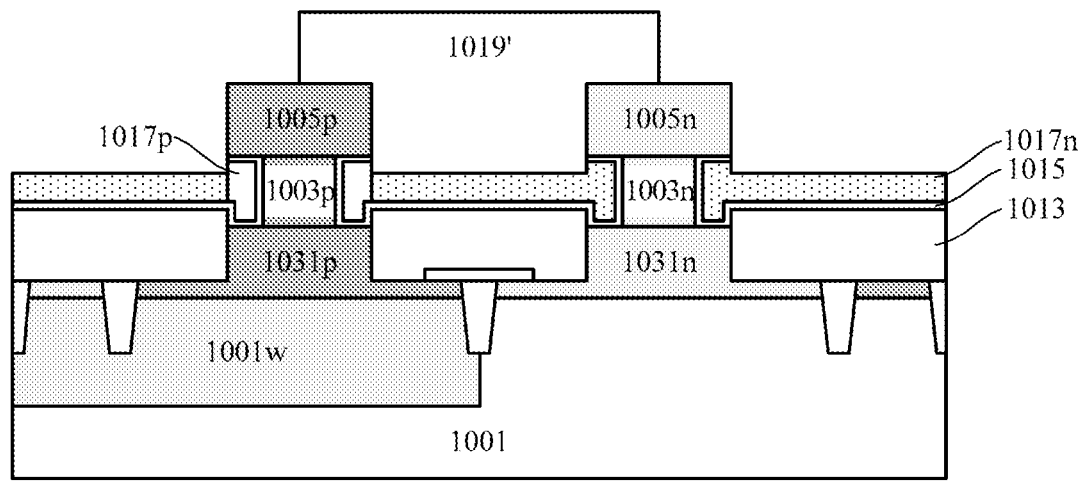
Figure 23B:
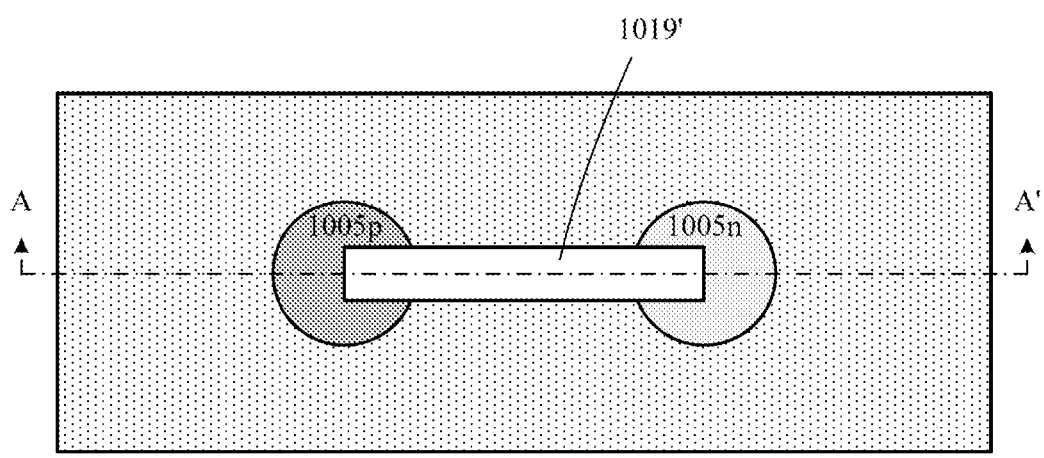
Figure 24A:
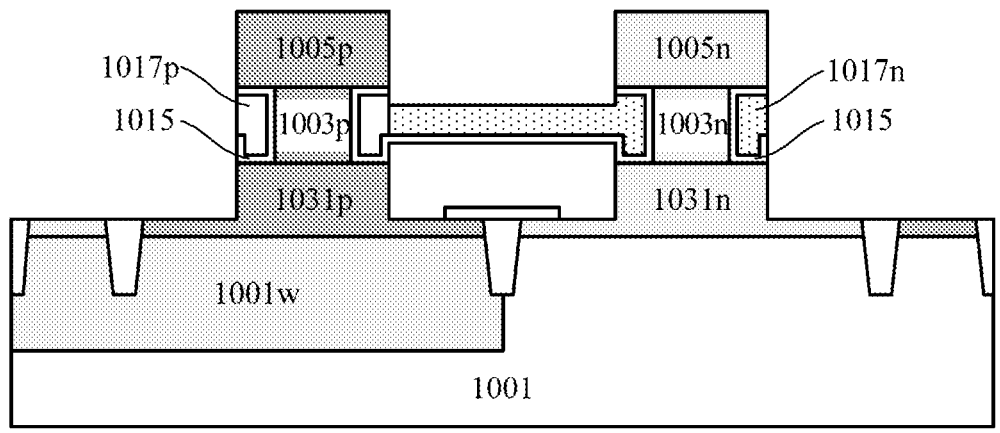
Figure 24B:
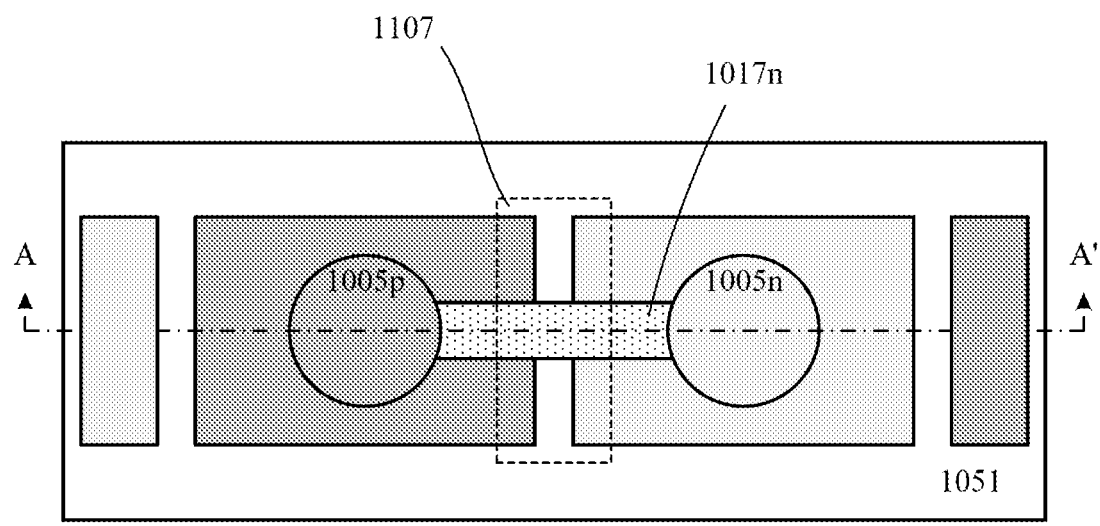

As shown in FIGS. 23(a) and 23(b) (FIG. 23(a) is a sectional view, and FIG. 23(b) is a top view with line AA' indicating the location where the sectional view is taken), the respective gate stacks of the p-type device and the n-type device may be formed and then photoresist 1019' is formed to pattern the gate conductor layer to form the gate contact pad. Differently from the embodiments described above, in this example, the photoresist 1019' continuously extends between the p-type device region and the n-type device region. Then, as shown in FIGS. 24(a) and 24(b) (FIG. 24(a) is a sectional view, and FIG. 24(b) is a top view with line AA' indicating the location where the sectional view is taken), the gate conductor layer 1017n extends from the n-type device to the p-type device. In addition, in FIG. 24(b), the conductive bridge 1017 is schematically shown by a dashed box.

Figure 25:
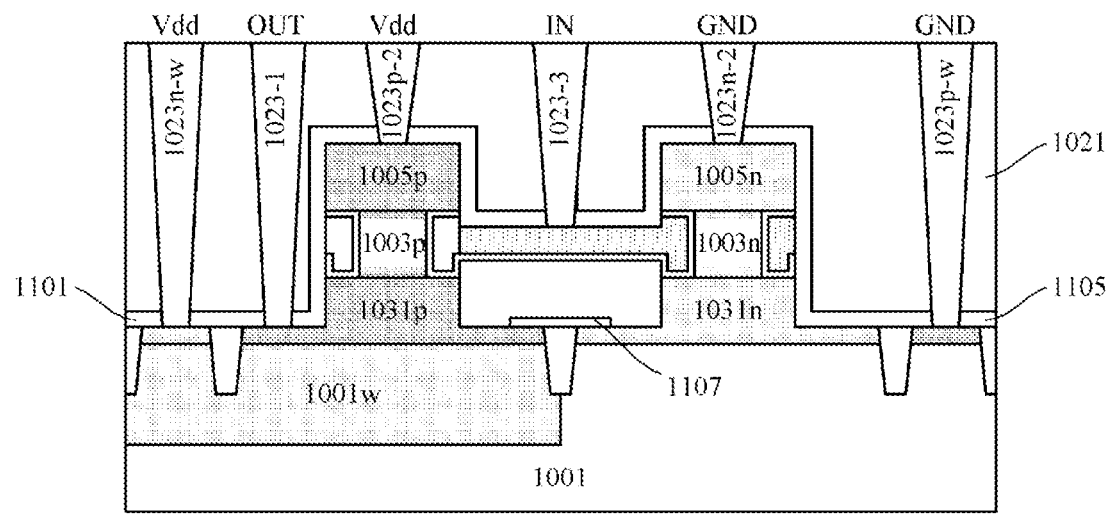

FIG. 25 shows a structure of the device after the formation of the contacts. As shown in FIG. 25, in this example, the p-type device and the n-type device may share the gate contact 1023-3 and the source/drain contact 1023-1. Other connections may be the same as those in the foregoing embodiments. It can be seen that the number of the contacts is reduced from 8 to 6, so that an area for the contacts can be reduced.

Figure 26:
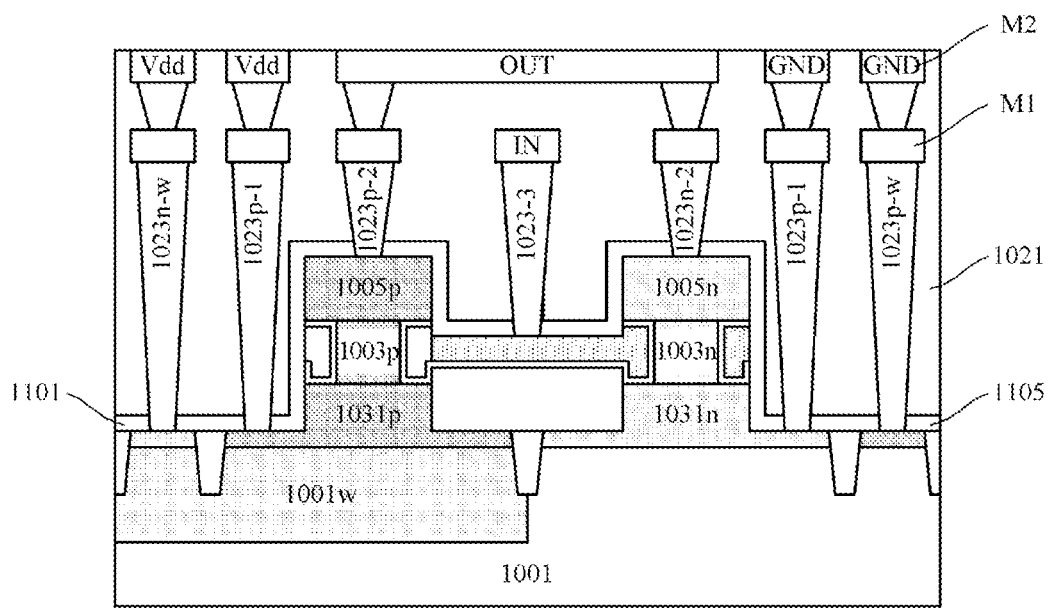
FIG. 26 is a cross-sectional view showing a semiconductor device according to another embodiment of the present disclosure.

FIG. 26 is a cross-sectional view showing a semiconductor device according to another embodiment of the present disclosure.

Several layers in metalization, such as a first metal layer M1 and a second metal layer M2 and vias therebetween, are shown in FIG. 26. The p-type device and the n-type device may share the gate contact 1023-3 and may receive an input signal. However, in this example, there is no conductive bridge formed. the respective source/drain contacts 1023p and 1023n of the p-type device and the n-type device may be interconnected together in the second metal layer M2 and constitute an output. In the connection shown in FIG. 26, as described above, there is no junction leakage between the source/drain layer and the well region, so that the power consumption can be reduced.

According to embodiments of the present disclosure, the channel layer may have different thicknesses in different device regions (thereby providing different gate lengths).

Figure 29:
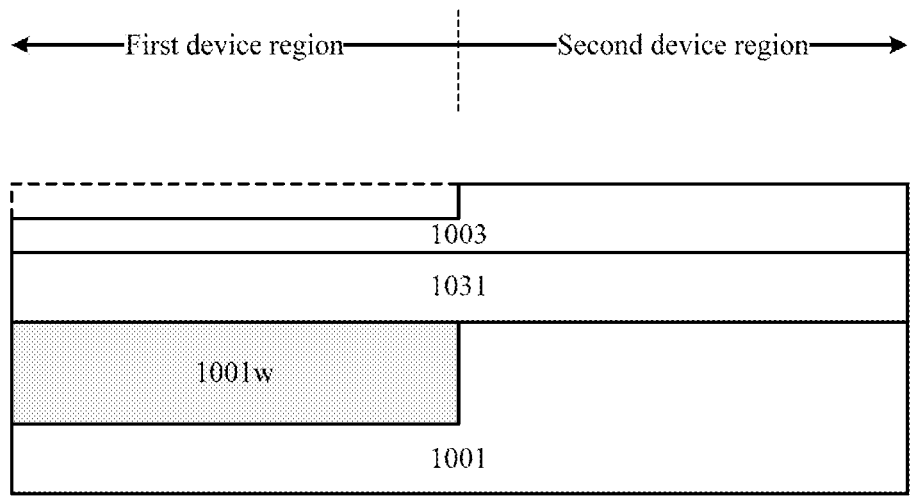
FIGS. 29 and 30 show schematic views of processes of thinning a channel layer according to an embodiment of the present disclosure.

For example, as shown in FIG. 29, the channel layer 1003 may be thinned after the first source/drain layer 1031 and the channel layer 1003 are grown on the substrate 1001 as described above in connection with FIG. 1. The first source/drain layer 1031 and the channel layer 1003 may be grown in a substantially uniform way (and therefore have a substantially uniform thickness so that their respective upper and lower surfaces may extend substantially in parallel to the substrate surface). In the first device region, the channel layer 1003 may have its thickness reduced by selective etching, in which case the second device region may be covered (for example, with photoresist). Thus, although the channel layer 1003 continues to extend integrally along a plane parallel to the substrate surface on the substrate 1001, the thickness thereof changes (as some of the top surface thereof is recessed).

Figure 30:
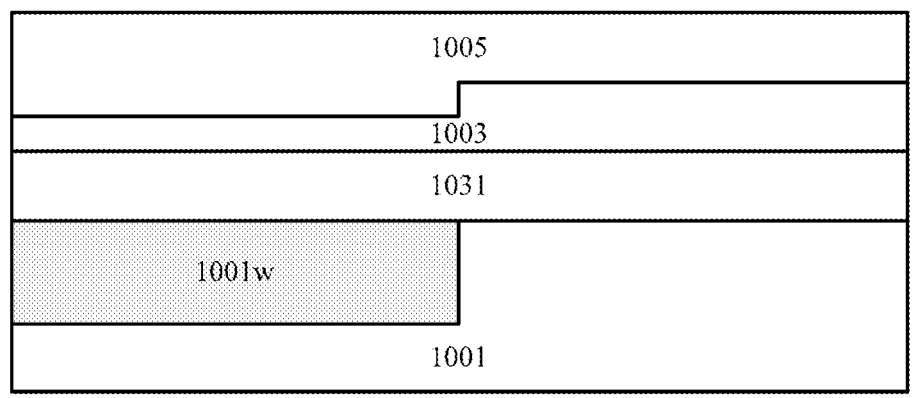

Then, as shown in FIG. 30, the second source/drain layer 1005 may be further grown on the channel layer 1003. With the growth of the second source/drain layer 1005, the difference in thicknesses between the respective device regions may gradually decrease or even eventually disappear (that is, the top surface of the second source/drain layer 1005 is substantially planar and substantially parallel to the substrate surface;. if the second source/drain layer 1005 is relatively thin, there may still be a thickness fluctuation that, however, does not affect subsequent processes.)

Figure 31:
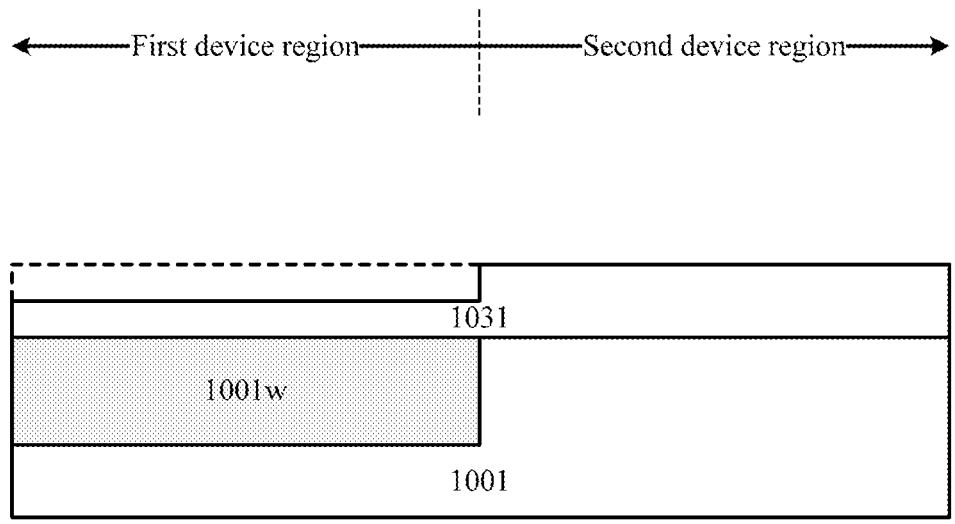
FIGS. 31 and 32 are schematic views showing a process of thinning a channel layer according to an embodiment of the present disclosure.

According to another embodiment, as shown in FIG. 31, the first source/drain layer 1031 may be thinned after the first source/drain layer 1031 is grown on the substrate 1001 as described above in connection with FIG. 1. The first source/drain layer 1031 may be grown in a substantially uniform way (and therefore have a substantially uniform thickness so that its upper and lower surfaces may extend substantially in parallel to f the substrate surface). In the first device region, the first source/drain layer 1031 may have its thickness reduced by selective etching, in which case the second device region may be covered (for example, with photoresist).

Figure 32:
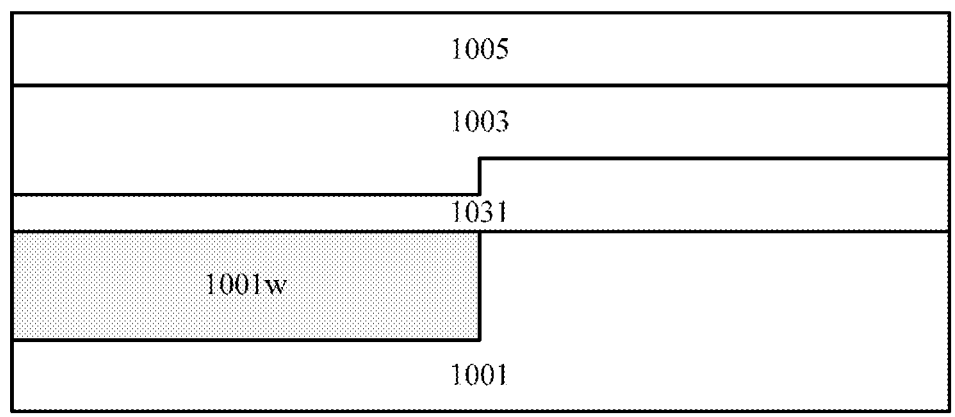

Then, as shown in FIG. 32, the channel layer 1003 may be further grown on the first source/drain layer 1031. With the growth of the channel layer 1003, the difference in thicknesses between the respective device regions may gradually decrease or even eventually disappear (that is, the top surface of the channel layer 1003 is substantially planar and substantially parallel to the substrate surface; if the channel layer 1003 is relatively thin, there may still be a thickness fluctuation that, however does not affect subsequent processes.) After that, the second source/drain layer 1005 may be further grown on the channel layer 1003.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor device, comprising:
a substrate;
a first device and a second device formed on the substrate, wherein each of the first device and the second device comprises:
  a first source/drain layer, a channel layer and a second source/drain layer stacked on the substrate in sequence; and
  a gate stack surrounding a periphery of the channel layer,
wherein the semiconductor device further comprises a first dielectric film formed on the first device and a second dielectric film formed on the second device, and the first dielectric film is in contact with the second dielectric film, and wherein the first dielectric film is in contact with the second dielectric film in a direction parallel to a surface of the substrate, an orthogonal projection of the first dielectric film on the substrate overlaps at least partially with an orthogonal projection of the second dielectric film on the substrate.

2. The semiconductor device of claim 1, wherein
an upper surface of the channel layer of the first device and an upper surface of the channel layer of the second device are co-planar; and/or
a lower surface of the channel layer of the first device and a lower surface of the channel layer of the second device are co-planar.

3. The semiconductor device of claim 1, wherein a thickness of the channel layer of the first device is different from a thickness of the channel layer of the second device, or a channel length of the first device is different from a channel length of the second device.

4. The semiconductor device of claim 1, further comprising:
gate contact pads extending from respective gate conductor layers in the respective gate stacks in a direction away from the respective channel layers, wherein the gate conductor layer and the corresponding gate contact pad of at least one of the first device and the second device comprise different materials.

5. The semiconductor device of claim 4, wherein the gate contact pads of the first device and the second device comprise the same material.

6. The semiconductor device of claim 4, wherein the gate conductor layer and the corresponding gate contact pad of the other of the first device and the second device comprise the same material and extend integrally.

7. The semiconductor device of claim 4, wherein the gate contact pads of the first device and the second device are connected electrically to each other.

8. The semiconductor device of claim 7, wherein the gate contact pads of the first device and the second device are directly connected physically to each other.

9. The semiconductor device of claim 1, wherein each of the channel layers of the first device and the second device comprises a semiconductor material which is different from that of the corresponding first source/drain layer and the corresponding second source/drain layer.

10. The semiconductor device of claim 1, wherein the channel layer comprises a channel layer single-crystalline semiconductor material.

11. The semiconductor device of claim 1, wherein there is a doping distribution in end portions of the respective channel layers close to the first source/drain layers and the second source/drain layers.

12. The semiconductor device of claim 1, further comprising:
an isolation layer formed on the substrate, wherein the isolation layer has a top surface at a level between top and bottom surfaces of the channel layer.

13. The semiconductor device of claim 1, wherein for each of the first device and the second device, the first source/drain layer is a semiconductor layer epitaxially grown on the substrate, the channel layer is a semiconductor layer epitaxially grown on the first source/drain layer, the second source/drain layer is a semiconductor layer epitaxially grown on the channel layer, and there are crystal interfaces and/or doping concentration interfaces between the source/drain layers and the channel layer.

14. The semiconductor device of claim 1, wherein for each of the first device and the second device, the channel layer has its periphery recessed inwards with respect to peripheries of the first source/drain layer and the second source/drain layer, and the gate stack is embedded into a recess which is formed by the periphery of the channel layer with respect to the peripheries of the first source/drain layer and the second source/drain layer.

15. The semiconductor device of claim 1, wherein for each of the first device and the second device, the periphery of the channel layer protrudes outwards with respect to the peripheries of the first source/drain layer and the second source/drain layer.

16. The semiconductor device of claim 1, wherein the first dielectric film is disposed on surfaces of the first source/drain layer and the second source/drain layer of the first device, and the second dielectric film is disposed on surfaces of the first source/drain layer and the second source/drain layer of the second device.

17. The semiconductor device of claim 1, wherein the first dielectric film corresponds to the first device and is configured to generate compressive or tensile stress, and the second dielectric film corresponds to the second device and is configured to generate tensile or compressive stress.

18. The semiconductor device of claim 17, wherein
the first device is an n-type device and the first dielectric film exhibits compressive stress in a direction perpendicular to a surface of the substrate, or the first dielectric film exhibits tensile stress in a direction perpendicular to a surface of the substrate in the channel layer of the n-type device; and
the second device is a p-type device and the second dielectric film exhibits tensile stress in the direction perpendicular to the surface of the substrate, or the second dielectric film exhibits compressive stress in the direction perpendicular to the surface of the substrate in the channel layer of the p-type device.

19. The semiconductor device of claim 1,
wherein in an overlapping region of the first dielectric film and the second dielectric film, a part of the first dielectric film is above a part of the second dielectric film; or in an overlapping region of the first dielectric film and the second dielectric film, a part of the second dielectric film is above a part of the first dielectric film.

* * * * *